United States Patent
Doi et al.

(10) Patent No.: US 8,261,162 B2
(45) Date of Patent: Sep. 4, 2012

(54) DECODING DEVICE, DECODING METHOD, AND MEDIA DATA DELIVERY SYSTEM

(75) Inventors: Kazumi Doi, Fukuoka (JP); Jun Endoh, Fukuoka (JP); Masahiro Abe, Fukuoka (JP); Naoyuki Takeshita, Fukuoka (JP); Takafumi Kamito, Fukuoka (JP); Koichi Onimaru, Fukuoka (JP); Yasutaka Umemoto, Kawasaki (JP); Noriyuki Ihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 397 days.

(21) Appl. No.: 12/731,856

(22) Filed: Mar. 25, 2010

(65) Prior Publication Data

US 2010/0251060 A1    Sep. 30, 2010

(30) Foreign Application Priority Data

Mar. 27, 2009    (JP) ................ 2009-080358

(51) Int. Cl.
*H03M 13/00*    (2006.01)

(52) U.S. Cl. ........ 714/776; 714/746; 714/751; 714/752; 714/753; 714/764; 714/799; 714/807

(58) Field of Classification Search ................ None
See application file for complete search history.

(56) References Cited

U.S. PATENT DOCUMENTS

| | | | | |
|---|---|---|---|---|
| 6,317,855 B1 * | 11/2001 | Horibe | ............ | 714/752 |
| 7,617,434 B1 * | 11/2009 | Huang | ............ | 714/755 |
| 7,725,797 B2 * | 5/2010 | Ver Steeg | ...... | 714/751 |
| 7,849,384 B2 * | 12/2010 | Costa et al. | ...... | 714/776 |
| 7,966,540 B1 * | 6/2011 | Lima et al. | ...... | 714/748 |
| 2007/0124651 A1 * | 5/2007 | Champel | ...... | 714/776 |
| 2007/0220405 A1 * | 9/2007 | Arnold et al. | ...... | 714/776 |
| 2007/0250754 A1 * | 10/2007 | Costa et al. | ...... | 714/758 |
| 2008/0222494 A1 * | 9/2008 | Gondo et al. | ...... | 714/776 |
| 2009/0271683 A1 * | 10/2009 | Costa et al. | ...... | 714/752 |
| 2010/0017685 A1 * | 1/2010 | Huang | ...... | 714/774 |

FOREIGN PATENT DOCUMENTS

JP    2008-131153 A    6/2008

OTHER PUBLICATIONS

"Pr0-MPEG Code of Practice, #3 Release 2", Jul. 2004, by Pro-MPEG Forum.*

* cited by examiner

*Primary Examiner* — John Trimmings

(74) *Attorney, Agent, or Firm* — Fujitsu Patent Center

(57) ABSTRACT

A decoding device includes a first receiving section for receiving a data packets, a second receiving section for receiving a plurality of error correction packets which includes matrix configuration information regarding the plural data packets, a deciding section for deciding a number of packets to be accumulated to restore a lost data packet, based on the matrix configuration information, an accumulating section for accumulating the data packets received by the first receiving section in the number of packets to be accumulated, and a restoring section for, when a loss of any of the data packets received by the first receiving section is detected, restoring the lost data packet by using at least one of the data packets and the error correction packets.

15 Claims, 14 Drawing Sheets

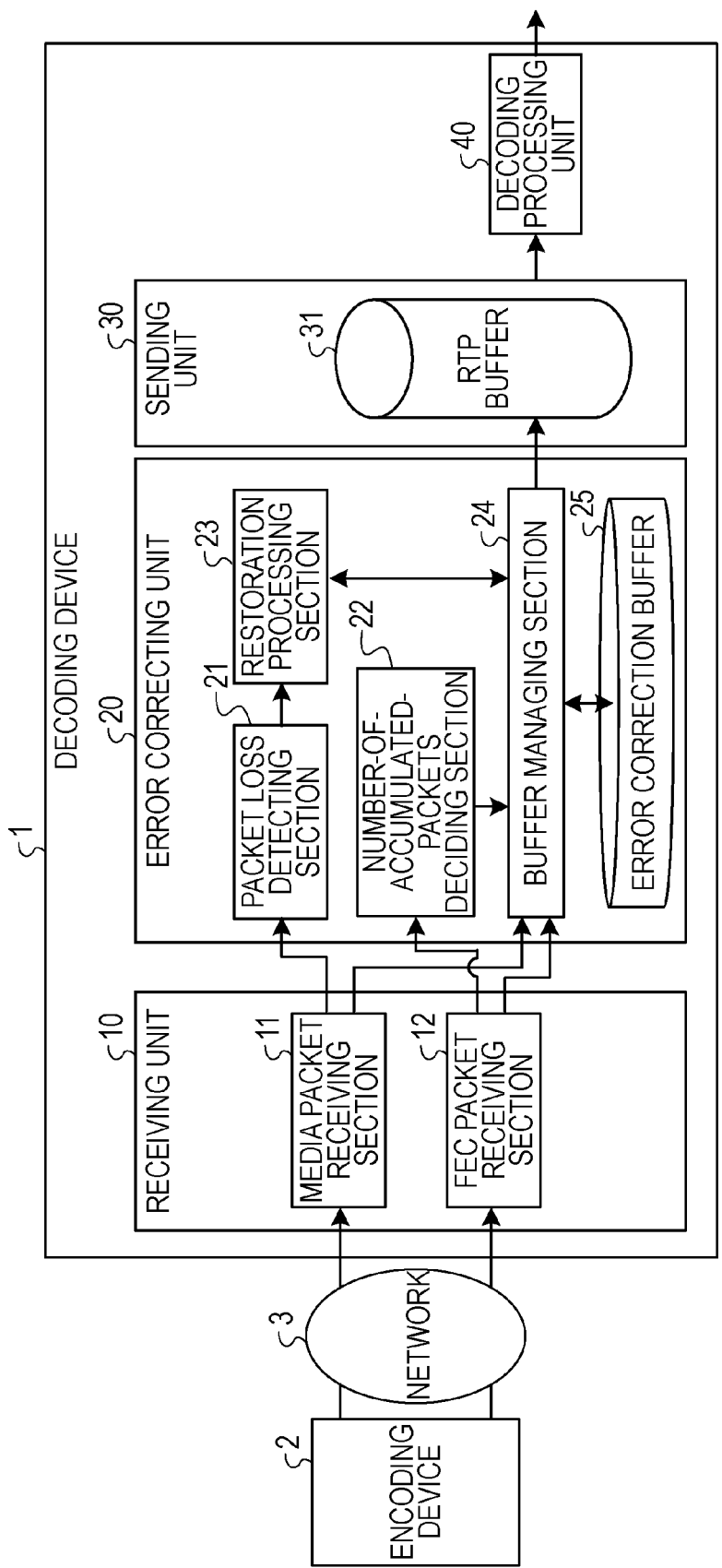

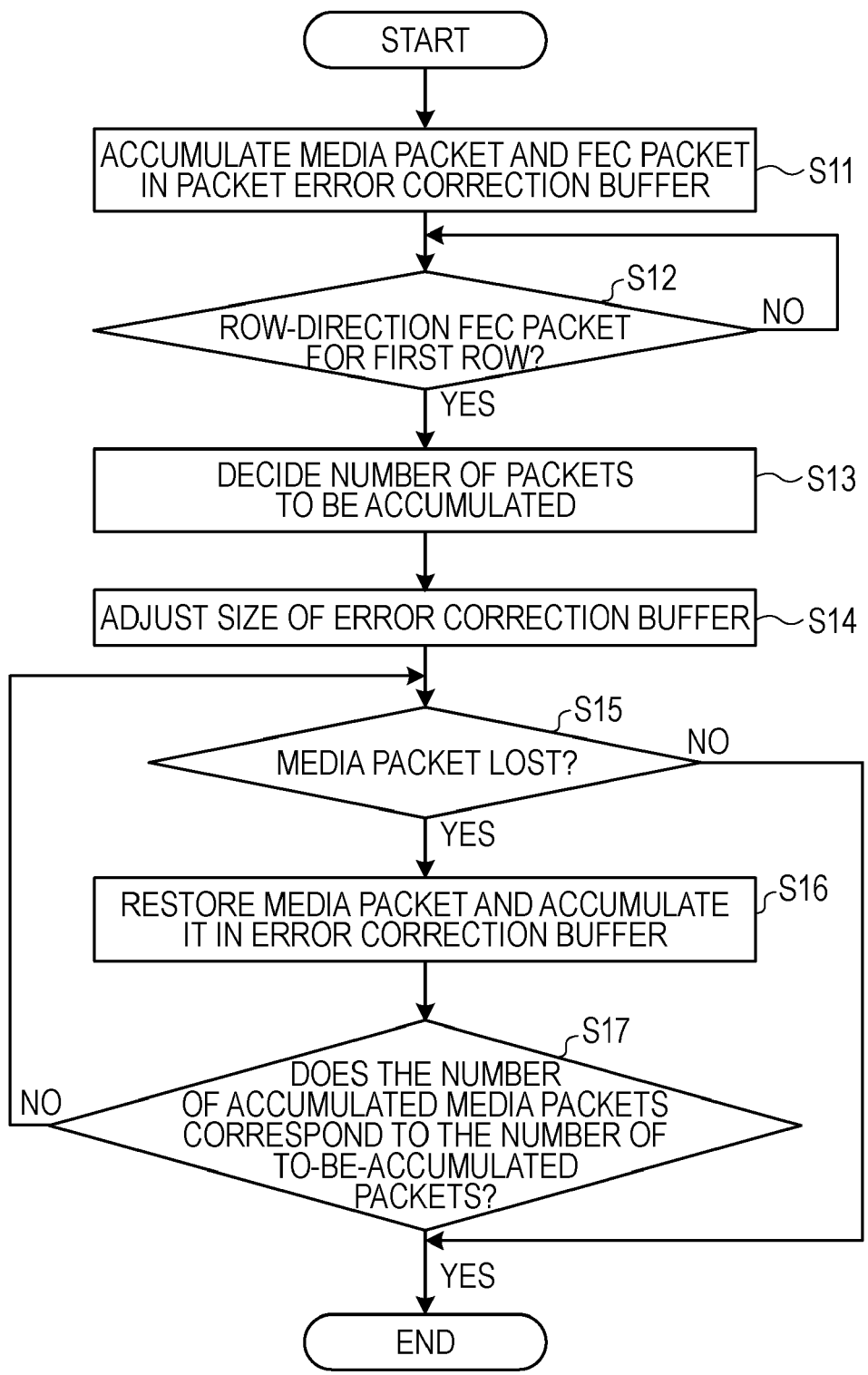

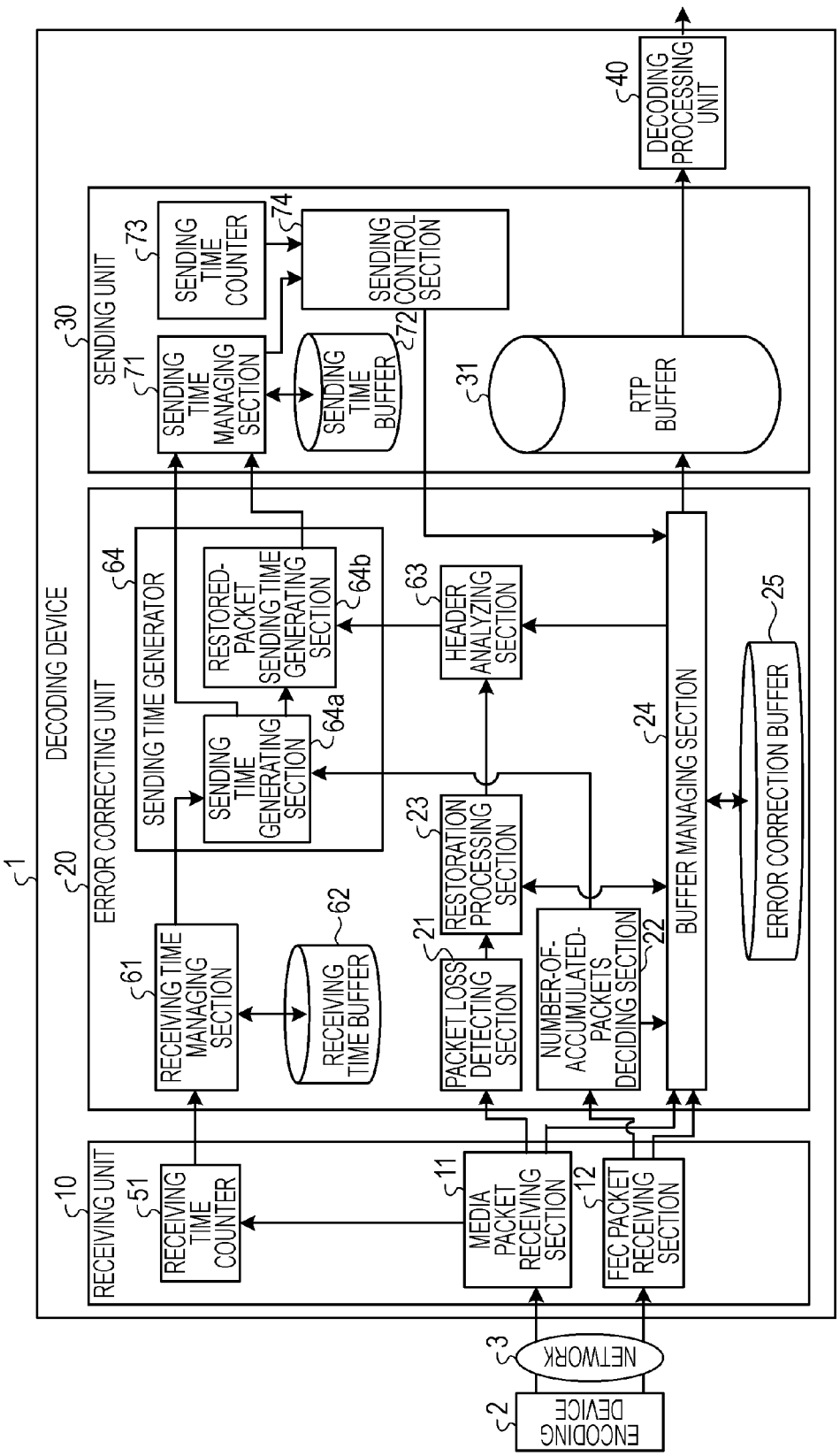

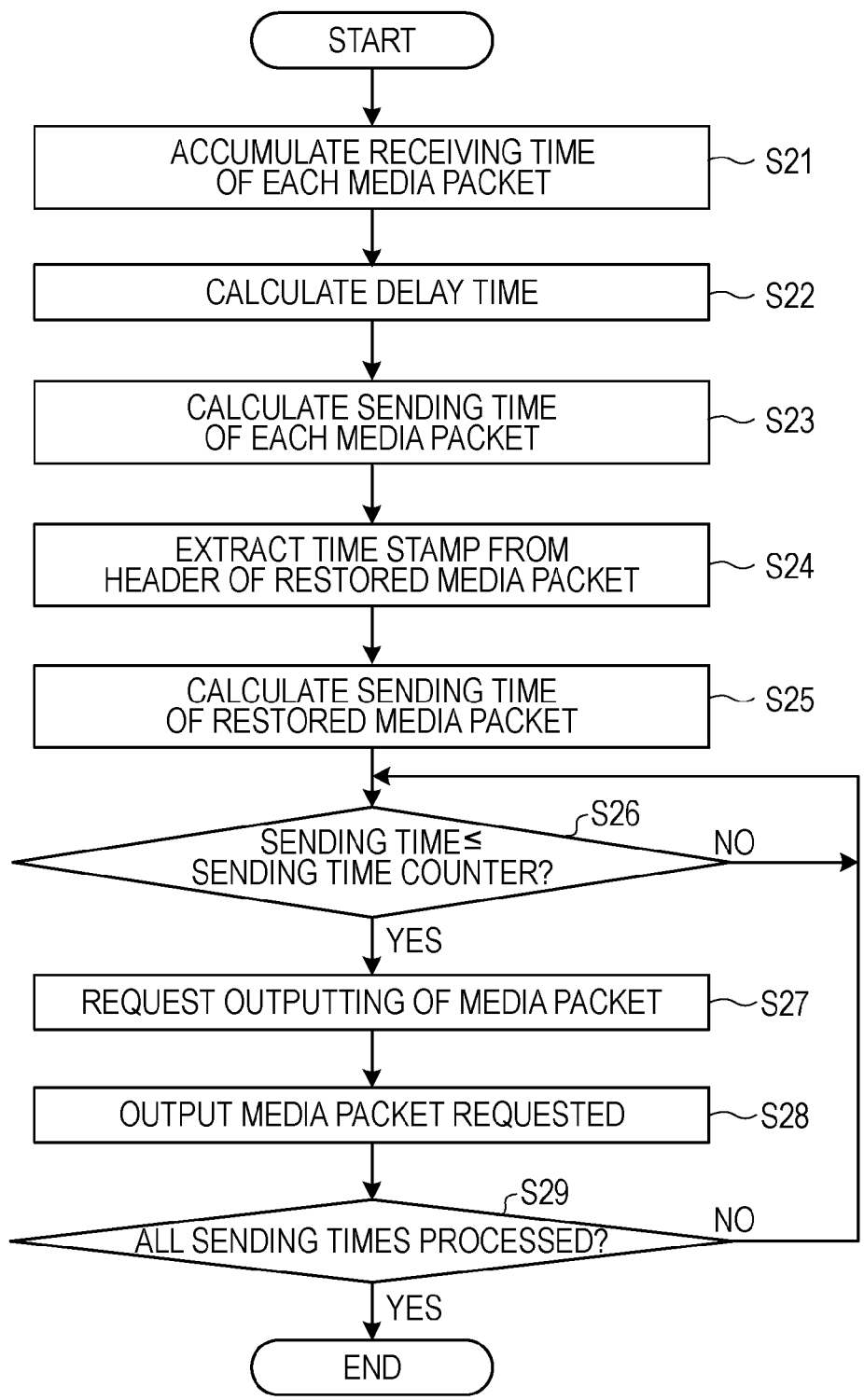

DECODING DEVICE, DECODING METHOD, AND MEDIA DATA DELIVERY SYSTEM

CROSS-REFERENCE TO RELATED APPLICATIONS

This application is based upon and claims the benefit of priority of the prior Japanese Patent Application No. 2009-80358, filed on Mar. 27, 2009, the entire contents of which are incorporated herein by reference.

FIELD

Embodiments described herein relate to a decoding device, a decoding method, and a media data delivery system.

BACKGROUND

Hitherto, an image and voice delivery system utilizing an IP (Internet Protocol) network, such as the Internet, has been generally practiced. In an image and voice delivery system including an encoding device and a decoding device as illustrated in FIG. 9, for example, images and voices are respectively received from a camera and a microphone, which are connected to the encoding device. Respective bit trains obtained by compressing and encoding the received images and voices are converted to UDP (User Datagram Protocol) packets and are sent to the decoding device via the Internet. The decoding device decodes the UDP packets to reproduce and output the images and the voices through a monitor and a speaker.

Transfer of the IP packets in such an image and voice delivery system is usually performed by a method using TCP (Transmission Control Protocol) or a method using the UDP. In the image and voice delivery system, in which importance placed on real-time operations, the UDP, which generally involves a smaller delay time, is used instead of applying priority to the reliability of data.

In the IP network, often, packets pass through a plurality of relay devices having different levels of performance until reaching a receiving terminal from a sending terminal. A transmission band may differ among the relay devices. Therefore, physical and electrical data errors may be caused. In addition, an overflow may be caused in traffic on a relay network or in an internal buffer of a relay device, and packets may be discarded midway in some cases. To reduce the influence of such a packet loss, it has been proposed to, when packets are sent using the UDP, utilize an ARQ (Automatic Repeat reQuest) method for limiting the number of times of resending in a higher-level layer, or an FEC (Forward Error Correction) method for sending redundant packets at all times to restore lost packets.

Further, a PRO-MPEG (Moving Picture Experts Group) method has recently been used to realize an even higher level of restoration by inserting a redundant packet into packets which are two-dimensionally arrayed in a matrix of 4 rows and 5 columns, for example.

The FEC method as a base of the PRO-MPEG method is described below with reference to FIG. 10. FIG. 10 illustrates one example of a manner of producing an FEC packet. As illustrated in FIG. 10, the FEC packet is produced by computing the exclusive logical sum (XOR) per bit in ten packets, for example.

Assume, for example, that a bit train of a first packet is represented by "1, 1, 1, 0, 0, 0 . . . ", and a bit train of a second packet is represented by "1, 0, 1, 1, 0, 1 . . . ". In this case, a value "0" resulting from computing XOR of "1" as a first bit of the first packet and "1" as a first bit of the second packet is set to a first bit of an FEC packet. By similarly computing XOR per bit subsequent to a second bit, the FEC packet between the first packet and the second packet is obtained. Further, a next FEC packet is obtained by similarly computing XOR per bit between the above FEC packet and the third packet. By repeating similar computations until the tenth packet, one FEC packet is obtained for the ten packets.

When the decoding device on the receiving side receives the ten packets and the one FEC packet, the decoding device recognizes whether disarrangement of the packets and loss of any packets are generated, by utilizing information representing the order of the received packets (e.g., sequence numbers within RTP headers). When only one of the ten packets is lost, the lost packet is restored by computing XOR between the remaining nine packets and the FEC packet.

To restore the lost packet as described above, the encoding device is required to precisely send the FEC packet to the decoding device on the receiving side. To that end, there is proposed a method of sending packets by inserting an FEC packet as illustrated in FIG. 11, for example.

In an example of FIG. 11, the encoding device produces one FEC packet from four packets and sends the FEC packet once per five times of sending. Stated another way, after sending four media (data) packets, the encoding device sends one FEC packet which is produced from those four packets. Such a method is advantageous in providing a low total rate of the data packets and the FEC packet because an insertion frequency of the FEC packet is low. However, such a method is not adaptable for loss of successive packets (e.g., cannot recover lost packets when the lost packets are successive).

In the PRO-MPEG method, the FEC packets are inserted in a two-dimensional row and column pattern. A manner of inserting the FEC packets based on the PRO-MPEG method is described below with reference to FIG. 12. In the PRO-MPEG method using a matrix of 4 rows and 5 columns, as illustrated in FIG. 12, the encoding device inserts one FEC packet for every 5 packets in the row direction similarly to the FEC method, and further inserts one FEC packet for every 4 packets in the column direction.

For example, a row-direction FEC packet FEC'1 in the first row is produced by computing XOR per bit for packets Pkt1 to 5 which are successively arranged. Also, a column-direction FEC packet FEC1 in the first column is produced by computing XOR per bit for packets Pkt1, 6, 11 and 16 which are discretely arranged. The row-direction FEC packet is sent, for example, at the timing after the row-direction five packets Pkt1 to 5 have been sent. For such a reason as to avoid a situation where data packets are not sent successively, the column-direction FEC packets are discretely sent at the timings when specified packets in a packet group Pkt21 to 40 arranged in a subsequent matrix are sent.

The feature of the PRO-MPEG method of producing the FEC packets to be inserted in a two-dimensional matrix is now described with reference to FIG. 13. FIG. 13 illustrates the feature of the PRO-MPEG method. As seen from FIG. 13, the PRO-MPEG method is adaptable (e.g., can recover lost packets) even for the case where packets are successively lost and the lost packets cannot be restored by the FEC method.

For example, when the packets Pkt1 to 5 are lost successively, the packet Pkt1 can be restored (as denoted by m1) by receiving the column-direction FEC packet (FEC1) for the first column. Also, the packet Pkt2 can be restored (as denoted by m2) by receiving the column-direction FEC packet (FEC2) for the second column. Further, the packets Pkt3 and Pkt4 can be restored (as denoted by m3 and m4) by receiving the column-direction FEC packets FEC3 and FEC4, respectively. With the restoration of the packets Pkt1 to 4, the packet Pkt5 can be restored (as denoted by m5) from the packet Pkt4 and FEC'1.

Japanese Unexamined Patent Application Publication No. 2008-131153 discloses a technique for storing the above-described FEC packets separately from the data packets and executing an FEC computation process dividedly at different times for an error correction process, thereby reducing and/or preventing an abrupt increase in amount of computations.

SUMMARY

According to an aspect of the invention, a decoding device includes a first receiving section to receive a plurality of data packets arranged in rows and columns, a second receiving section to receive a plurality of error correction packets which are produced one per row and per column of the plural data packets and each of which includes matrix configuration information regarding the plural data packets, a deciding section to decide a number of packets to be accumulated to restore a lost data packet, based on the matrix configuration information, an accumulating section to accumulate the data packets received by the first receiving section in the number of packets to be accumulated, and a restoring section to, when a loss of any of the data packets received by the first receiving section is detected, restore the lost data packet by using at least one of the data packets and at least one of the error correction packets, which have been accumulated by the accumulating section.

The object and advantages of the invention will be realized and attained by unit of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1 is a functional block diagram illustrating the configuration of a decoding device according to a first embodiment;

FIG. 2 is a flowchart illustrating the an error correction method in the decoding device according to the first embodiment;

FIG. 3 is a functional block diagram illustrating the configuration of a decoding device according to a second embodiment;

FIG. 5 is a flowchart illustrating a sending time generation method in the decoding device according to the second embodiment;

DESCRIPTION OF EMBODIMENTS

However, when the PRO-MPEG method is used to execute error correction, the number of packets required to be accumulated for the error correction is larger than the case using the FEC method, thus resulting in a problem that a longer delay time is generated until shifting to a decoding process, which is executed after the error correction. Another problem is that, because the number of packets required to be accumulated for the error correction is larger than that required in the case using the FEC method, a large number of packets are sent to the decoding process at a time after the error correction in some cases (such a phenomenon is referred to as a "burst" hereinafter).

First, in the PRO-MPEG method, there is a specification for the purpose of the error correction that a total number of packets in one matrix shall not exceed 100 packets. Accordingly, about 200 packets at maximum are accumulated.

The reason is as follows. When PRO-MPEG data is received by using a two-dimensional matrix of 10 rows×10 columns, for example, the error correction for a plurality of packets included in one matrix (e.g., a matrix A) requires a plurality of FEC packets which are discretely received at timings when specified packets included in a matrix (e.g., a matrix B) subsequent to the matrix A are received. In view of the above-described reception timings, the FEC packets, the matrix A, and the matrix B are to be accumulated.

When a data stream is at a low bit rate, the number of packets received within a unit time is smaller than the case of a high bit rate. Accordingly, if about 200 packets at maximum are always accumulated, a longer accumulation time is taken than that in the case of a high bit rate, and a larger delay is caused in a time taken until shifting to the decoding process.

Further, if about 200 packets at maximum are always accumulated, a burst of about 200 packets at maximum may be caused in some cases. The problem regarding such a burst is described below, by way of example, with reference to FIG. 14.

Figure 14:
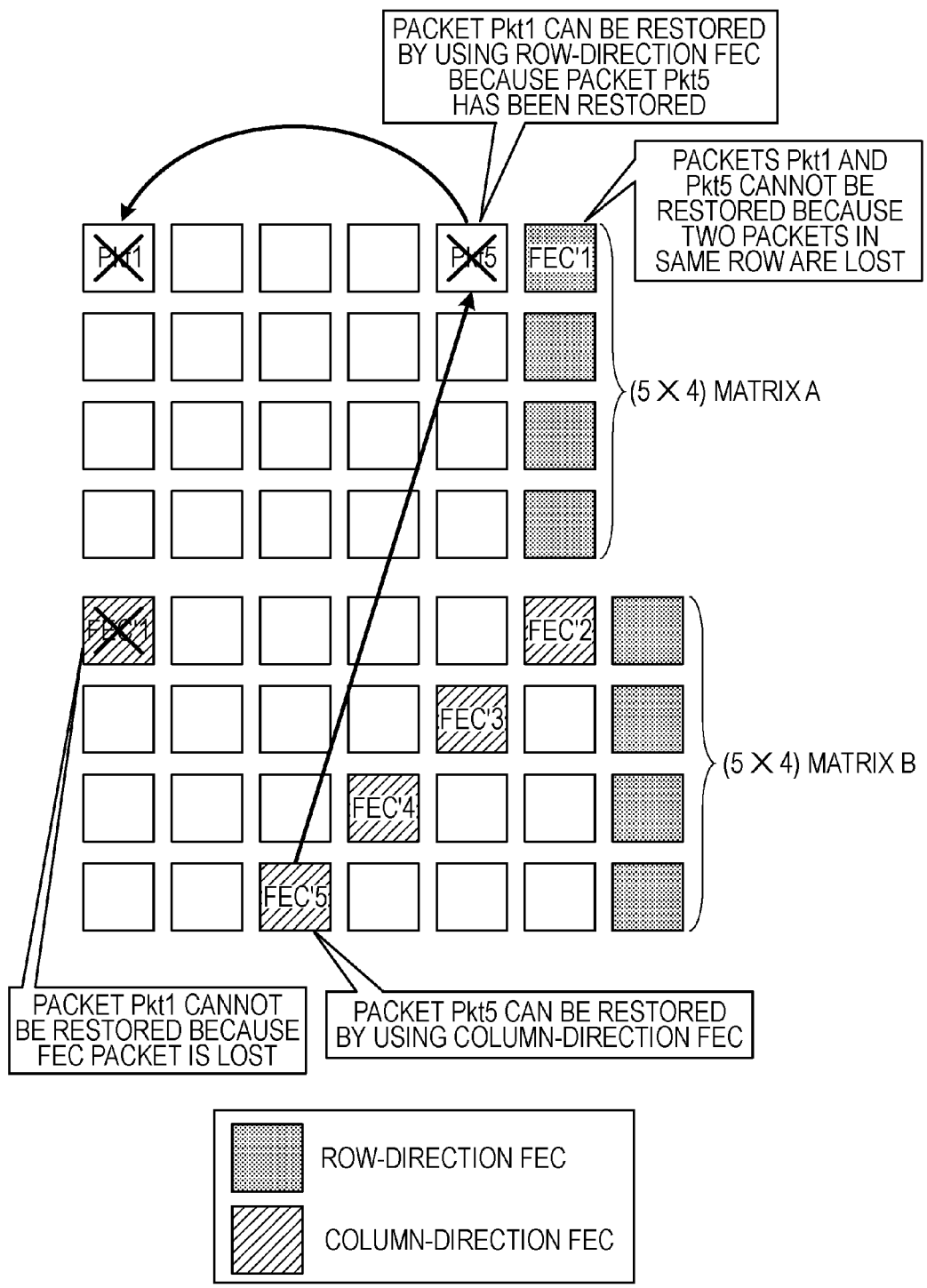
FIG. 14 illustrates an example of a burst in the FEC using the PRO-MPEG method.

Assuming the case of receiving PRO-MPEG data by using a two-dimensional matrix of 4 rows×5 columns, as illustrated in FIG. 14, if row-direction packets Pkt1 and Pkt5 in the first row of a matrix A are lost, the row-direction packets Pkt1 and Pkt5 cannot be restored by using a row-direction FEC packet (FEC'1). Further, if a column-direction FEC packet (FEC1) in the first column of a matrix A is lost, the packet Pkt1 cannot be restored. Therefore, the decoding device has to wait for restoration of the packet Pkt5. After the packet Pkt5 is restored by using a column-direction FEC packet (FEC5) which is in a final row of a matrix B and which corresponds to the fifth column of the matrix A, the packets Pkt1 is restored. At that time, if there are no errors in the packets included in the matrix B, the packets in two matrixes, i.e., the matrix A and the matrix B, are all brought into a sendable state. Hence, a burst is caused in an amount corresponding to the number of packets in two matrixes.

In view of the above-described problems in the art, which have been recognized by the inventors of the instant application, an object of embodiments described in this application is to provide a decoding device, a decoding method, and a media data delivery system. For example, an object of the embodiments described herein may shorten a delay time taken until shifting to a decoding process and may reduce a burst amount, i.e., a data amount to be sent in the event of a burst.

At least in part to solve the above problems and to achieve the above object, embodiments of the decoding device, the decoding method, and the media data delivery system according to the invention will be described below in detail with reference to the drawings. The decoding device according to the invention is described as a media data decoding device. It is noted that the invention is in no way limited by the following embodiments.

FIG. 1 is a functional block diagram illustrating the configuration of a decoding device according to a first embodiment. As illustrated in FIG. 1, a decoding device 1 is connected to an encoding device 2 via a network 3.

The encoding device 2 produces media packets obtained by compressing and encoding media data, for example, moving pictures and voices, and PRO-MPEG FEC packets. The encoding device 2 sends the produced packets to the decoding device 1. The media packets and the PRO-MPEG FEC packets are packets in conformity with the RTP (Real-time Transport Protocol).

The PRO-MPEG FEC packet is described here. The PRO-MPEG FEC packet is an FEC packet which is produced based on the PRO-MPEG method and which is cyclically inserted, for example, to recover (compensate for) a loss of the media packets, which have occurred on the network 3. Hereinafter, the PRO-MPEG FEC packet is abbreviated to the "FEC packet".

More specifically, the FEC packets are produced by the encoding device 2 one per row and per column of a plurality of media packets arranged in a two-dimensional matrix.

The FEC packet per row (e.g., one FEC packet for each row) is inserted to be sent following a plurality of media packets which can be restored from the lost state by using the FEC packet. On the other hand, the FEC packet per column (e.g., one FEC packet for each column) is inserted to be sent at the same timing as some of a plurality of media packets arranged in a next two-dimensional matrix that is sent following a plurality of media packets which can be restored from the lost state by using the column-direction FEC packets.

The decoding device 1 includes a receiving unit 10, an error correcting unit 20, a sending unit 30, and a decoding processing unit 40.

The processing executed by the decoding device 1 is summarized here. Upon receiving the media packets and the FEC packets from the encoding device 2, the decoding device 1 extracts matrix configuration information regarding a two-dimensional matrix and being included in the FEC packet. The decoding device decides, based on the matrix configuration information, a minimum number of packets to be accumulated to restore the lost media packet. Further, the decoding device 1 accumulates, together with a plurality of media packets in the decided number of packets to be accumulated, a plurality of FEC packets received at the same timings as specified ones of the plurality of media packets. In addition, upon detecting the loss of the media packet, the decoding device 1 restores the media packet, of which loss has been detected, by using the media packet(s) and the FEC packet(s) which have been accumulated. Details of the processing executed by the decoding device 1 is described in greater detail later.

The receiving unit 10 is a functional unit for receiving the media packets and the FEC packets from the encoding device 2. The receiving unit 10 includes a media packet receiving section 11 and an FEC packet receiving section 12.

The media packet receiving section 11 receives the media packets sent from the encoding device 2 at a first port of receiving unit 10. Further, the media packet receiving section 11 outputs the received media packets to a packet loss detecting section 21 and a buffer managing section 24, which are described later.

The FEC packet receiving section 12 receives the FEC packets, which are sent from the encoding device 2, at a second port differing from the first port at which the media packets are received. Further, the FEC packet receiving section 12 outputs the received FEC packets to a number-of-accumulated-packets deciding section 22 and the buffer managing section 24. More specifically, the FEC packet receiving section 12 outputs first received one of the plurality of FEC packets produced to recover a loss occurred in the plurality of media packets arranged in a two-dimensional matrix, i.e., a row-direction FEC packet for the first row, to the number-of-accumulated-packets deciding section 22. In addition, the FEC packet receiving section 12 outputs the received FEC packet to the buffer managing section 24.

The timing at which the FEC packet receiving section 12 receives the FEC packet with respect to the media packets is described here.

For example, a respective FEC packet for each row of the plurality of media packets arranged in a two-dimensional matrix is received substantially immediately after the media packets arranged in each row. On the other hand, the FEC packet for each column is received at the same timing as some of the plurality of media packets arranged in a next two-dimensional matrix that follows the plurality of media packets which are arranged in a two-dimensional matrix and which can be restored from the lost state by using the FEC packet(s). This implies that, at the time when the FEC packets corresponding to the plurality of media packets arranged in a two-dimensional matrix are all just received, the plurality of media packets which are arranged in a two-dimensional matrix and which follow the media packets in the preceding two-dimensional matrix are also all received.

While the FEC packet receiving section 12 has been described as receiving the FEC packets at the second port differing from the first port at which the media packets are received, the receiving unit 10 may be configured or designed so as to receive both the packets at one port. Further, a port for receiving the row-direction FEC packet and a port for receiving the column-direction FEC packet may be separately provided such that the FEC packet receiving section 12 receives the row-direction FEC packet and the column-direction FEC packet at the different ports, respectively.

The error correcting unit 20 is a functional unit for recovering the loss of the media packet. The error correcting unit 20 includes a packet loss detecting section 21, a number-of-accumulated-packets deciding section 22, a restoration processing section 23, a buffer managing section 24, and an error correction buffer 25.

The packet loss detecting section 21 determines whether the media packet is lost, and detects the lost media packet based on the determination result. More specifically, upon receiving the media packet from the media packet receiving section 11, the packet loss detecting section 21 extracts the sequence number included in an RTP header of the media packet. If a loss of the media packet is detected from the extracted result, the packet loss detecting section 21 requests the restoration processing section 23 to restore the media packet having the lost sequence number. The term "sequence number" implies a number uniquely assigned per media packet and also implies a number representing the order in which the relevant media packet is to be reproduced. In principle, the media packets are arranged in ascending order from the smallest sequence number.

The number-of-accumulated-packets deciding section 22 extracts the matrix configuration information regarding the two-dimensional matrix from the TCP header of the FEC packet and decides the number of packets to be accumulated, which is least necessary to restore the lost media packet, based on the extracted matrix configuration information regarding the two-dimensional matrix. The matrix configuration information regarding the two-dimensional matrix is information including the number of rows and the number of columns of the two-dimensional matrix in which the media packets are arranged.

More specifically, the number-of-accumulated-packets deciding section 22 multiplies the number of rows by the number of columns of the two-dimensional matrix, which are included in the matrix configuration information regarding the two-dimensional matrix, thus calculating the number of media packets arranged in the two-dimensional matrix. Further, the number-of-accumulated-packets deciding section 22 multiplies the calculated number of media packets by 2 and sets the number of media packets corresponding to two of the two-dimensional matrixes as the number of packets to be accumulated.

The reason is as follows. In order to recover all types of losses of the media packets arranged in the two-dimensional matrix, the row-direction and column-direction FEC packets corresponding to the two-dimensional matrix are required to be stored in advance. However, the column-direction FEC packet is received at the same timing as some of the media packets arranged in the succeeding two-dimensional matrix. In other words, at the time when all the column-direction FEC packets are accumulated, the plurality of media packets arranged in the succeeding two-dimensional matrix are also accumulated.

Further, the number-of-accumulated-packets deciding section 22 outputs the number of to-be-accumulated packets to the buffer managing section 24.

The restoration processing section 23 restores the lost media packet. More specifically, when the restoration processing section 23 is requested from the packet loss detecting section 21 to restore the media packet having the sequence number for which the loss has been detected, the restoration processing section 23 obtains the media packet(s) and the FEC packet(s), which are used and/or necessary to restore the lost media packet, from the error correction buffer 25, and then computes XOR of the obtained packets, thus restoring the lost media packet.

Assuming, for example, the case where the matrix configuration information regarding the two-dimensional matrix indicates a 4-row and 5-column matrix and the media packet arranged at a cross point between the first row and the second column is lost, the restoration processing section 23 obtains the other media packets arranged in the first row and the FEC packet for the first row from the error correction buffer 25, and then computes XOR of the obtained packets, thus restoring the media packet arranged at the cross point between the first row and the second column. On that occasion, if even another one of the other media packets arranged in the first row is lost, the restoration processing section 23 obtains the other media packets arranged in the second column and the FEC packet for the second column from the error correction buffer 25, and then computes XOR of the obtained packets, thus restoring the media packet arranged at the cross point between the first row and the second column.

Further, the restoration processing section 23 additionally accumulates the restored media packet to a position in the error correction buffer 25, which corresponds to the relevant sequence number.

The buffer managing section 24 adjusts the number of media packets accumulated in the error correction buffer 25. More specifically, upon obtaining the number of to-be-accumulated packets from the number-of-accumulated-packets deciding section 22, the buffer managing section 24 sets the size of the error correction buffer 25 to the number of to-be-accumulated packets. For example, the buffer managing section 24 may set, in a counter, an effective packet number corresponding to the media packets accumulated in the error correction buffer 25 and may manage the counter.

Further, the buffer managing section 24 checks whether the number of media packets having been accumulated in the error correction buffer 25 is equal to the number of to-be-accumulated packets. If both the numbers of packets are equal to each other, the buffer managing section 24 outputs the plurality of media packets, which have been accumulated in the error correction buffer 25, to the sending unit 30 for decoding. In other words, the buffer managing section 24 outputs the media packets corresponding to the number of packets accumulated in the error correction buffer 25 to the sending unit 30. The media packets corresponding to the number of packets accumulated in the error correction buffer 25 may be sent by the sending unit 30 at the same time, for example.

The error correction buffer 25 is a storage area including a media buffer for accumulating the media packets and an FEC buffer for accumulating the FEC packets. The FEC buffer may include a buffer for accumulating the row-direction FEC packets and a buffer for accumulating the column-direction FEC packets such that the row-direction FEC packets and the column-direction FEC packets are separately accumulated, for example.

The sending unit 30 is a functional unit for sending the media packets to the decoding processing unit 40. The sending unit 30 includes an RTP buffer 31. The RTP buffer 31 is a storage area for temporarily accumulating the media packets to send the media packets to the decoding processing unit 40.

Upon obtaining a number of media packets corresponding to the number of to-be-accumulated packets from the buffer managing section 24, the sending unit 30 sends the obtained media packets to the decoding processing unit 40 through the RTP buffer 31. While the sending unit 30 may output a number media packets corresponding to the number of to-be-accumulated packets to the decoding processing unit 40 at the same time in this embodiment, the invention is not limited to such a sending manner. For example, the media packets may be output at different sending timings shifted per media packet.

The decoding processing unit 40 is a functional unit for decoding the media packets. More specifically, the decoding processing unit 40 decodes the media packets output from the sending unit 30 through the RTP buffer 31 and outputs the decoded media packets to an output unit, e.g., a monitor or speaker.

The operations and/or process of an error correction method in the decoding device 1 according to the first embodiment is described below with reference to FIG. 2. FIG. 2 is a flowchart illustrating the operations and/or processes processing steps of the error correction method in the decoding device 1 according to the first embodiment.

First, upon receiving the media packet output from the encoding device 2, the media packet receiving section 11 accumulates the received media packet in the error correction buffer 25 through the buffer managing section 24 (S11). At that time, the media packet receiving section 11 outputs the received media packet to the packet loss detecting section 21.

Also, upon receiving the FEC packet output from the encoding device 2, the FEC packet receiving section 12 accumulates the received FEC packet in the error correction buffer 25 through the buffer managing section 24 (S11).

Further, the FEC packet receiving section 12 determines whether the received FEC packet is the row-direction FEC packet for the first row among the FEC packets produced to recover the loss of any of the media packets arranged in the two-dimensional matrix (S12).

If it is determined that the received FEC packet is the row-direction FEC packet for the first row (Yes in S12), the number-of-accumulated-packets deciding section 22 extracts the matrix configuration information regarding the two-dimensional matrix from a TCP header of the FEC packet and decides the number of packets to be accumulated, which is least necessary to restore the lost media packet, based on the extracted matrix configuration information (step S13). More specifically, the number-of-accumulated-packets deciding section 22 multiplies the number of rows by the number of columns of the two-dimensional matrix, which are included in the matrix configuration information. Further, the number-of-accumulated-packets deciding section 22 multiplies the calculated number of media packets by 2 and sets the number of media packets corresponding to two of the two-dimensional matrixes as the number of packets to be accumulated.

Then, the buffer managing section 24 adjusts the error correction buffer 25 according to the number of to-be-accumulated packets, which has been decided by the number-of-accumulated-packets deciding section 22, as an effective size of the error correction buffer 25 (S14).

Upon obtaining the media packet output from the media packet receiving section 11, the packet loss detecting section 21 monitors the sequence number included in the RTP header of the obtained media packet and determines, based on the monitoring result, whether a media packet has been lost (S15). If a media packet has been lost (Yes in S15), the packet loss detecting section 21 requests the restoration processing section 23 to restore the lost media packet.

Upon receiving the request to restore the lost media packet, the restoration processing section 23 restores the lost media packet by using the FEC packet(s) and the media packet(s) accumulated in the error correction buffer 25, and then accumulates the restored media packet in the error correction buffer 25 (S16).

Thereafter, the buffer managing section 24 determines whether the number of media packets in the error correction buffer 25 corresponds to the number of to-be-accumulated packets (S17).

If it is determined that the number of the media packets in the error correction buffer 25 does not correspond to the number of to-be-accumulated packets (No in S17), the buffer managing section 24 causes the method to return to S15 to restore the lost media packet.

If it is determined that the number of the media packets in the error correction buffer corresponds to the number of to-be-accumulated packets (Yes in S17), the buffer managing section 24 ends the error correction method.

After the end of the error correction process method, the buffer managing section 24 sends all of the media packets accumulated in the error correction buffer 25 to the decoding processing unit 40 through the RTP buffer 31.

According to the first embodiment, as described above, the decoding device 1 receives a plurality of media packets arranged in rows and columns, and also receives a plurality of FEC packets each of which includes the matrix configuration information regarding the plurality of media packets. Further, the decoding device 1 decides the number of packets to be accumulated, which is least necessary to restore the lost media packet, based on the extracted matrix configuration information regarding the plural media packets. Still further, the decoding device 1 accumulates the media packets received in the decided number of packets to be accumulated and the FEC packets received at the same timings as predetermined ones of those media packets. When a loss of any of the received media packets is detected, the decoding device 1 restores the media packet, for which the loss has been detected, by employing the accumulated media packet(s) and FEC packet(s).

With the above-described features, since the decoding device 1 can start the process of restoring the lost media packet immediately after accumulating the media packets in the least necessary number of to-be-accumulated packets to restore the lost media packet, a delay time caused by accumulating the media packets can be shortened and a delay time taken until shifting to the process in the subsequent decoding processing unit 40 can also be shortened. As a result, particularly, when a data stream is at a low bit rate, the decoding device 1 can shorten the delay time and hence can reduce a load imposed on the subsequent decoding processing unit 40.

Further, since the decoding device 1 accumulates the media packets just in the least necessary number of to-be-accumulated packets, which has been decided to restore the lost media packet, the burst amount can be reduced even when the media packets are sent in the decided number of to-be-accumulated packets to the decoding processing unit 40 at a time. As a result, the decoding device 1 can greatly reduce a load imposed on the subsequent decoding processing unit 40.

The delay time and the burst amount are compared below between the case where the media packets are always accumulated in number 200 at maximum and the case where the media packets are accumulated in the least necessary number of to-be-accumulated packets when the matrix configuration information of the media packet (RTP) indicates 4 rows and 4 columns. Calculations are made on an assumption that one media packet (RTP) is made up of seven TS (Transport Stream) packets.

When the media packets are always accumulated in number 200 at maximum, the maximum burst amount is given by:

$$200(RTP) \times 188(byte) \times 7(number\ of\ TSs) = 263200\ byte$$

On the other hand, when the media packets are accumulated in the least necessary number of to-be-accumulated packets in the case of 4 rows and 4 columns, the maximum burst amount is given by:

$$4 \times 4 \times 2(RTP) \times 188(byte) \times 7(number\ of\ TSs) = 48112\ byte$$

Accordingly, when the media packets are accumulated in the least necessary number of accumulated packets in the case of 4 rows and 4 columns, the burst amount can be reduced to about ⅕ of that resulting when the media packets are always accumulated in number 200 at maximum.

Also, the number of media packets (RTP) received for 1 sec is given by:

$$1300000(bit)/(188(byte) \times 8(bit) \times 7(number\ of\ TSs) = 123.4$$

Therefore, when the media packets are always accumulated in number 200 at maximum, the delay time is given by:

$$200(RTP)/123.4 = 1.6(sec)$$

On the other hand, when the media packets are accumulated in the least necessary number of to-be-accumulated packets in the case of 4 rows and 4 columns, the delay time is given by:

$$4\times4\times2(RTP)/123.4=0.3(sec)$$

Accordingly, when the media packets are accumulated in the least necessary number of to-be-accumulated packets in the case of 4 rows and 4 columns, the delay time can be reduced to about ⅕ of that resulting when the media packets are always accumulated in number 200 at maximum.

In the above-described first embodiment, the decoding device 1 accumulates a plurality of media packets in the least necessary number of to-be-accumulated packets to restore the lost media packet, thereby suppressing the burst amount, i.e., the number of media packets sent to the decoding processing unit 40 at a time in the event of a burst. However, the invention is not limited to the first embodiment, and it may be designed such that the decoding device 1 accumulates a plurality of media packets in the least necessary number of to-be-accumulated packets to restore the lost media packet, and further generates a sending time for each of the accumulated media packets, thereby reducing and/or eliminating a burst in which many media packets are sent to the decoding processing unit 40 at a time.

The following description is therefore made for the case, as a second embodiment, where the decoding device 1 accumulates a plurality of media packets in the least necessary number of to-be-accumulated packets to restore the lost media packet, and further generates a sending time for each of the accumulated media packets, thereby eliminating a burst that many media packets are sent to the decoding processing unit 40 at a time.

First, the configuration of a decoding device 1 according to the second embodiment is described with reference to FIG. 3. FIG. 3 is a functional block diagram illustrating the configuration of the decoding device 1 according to the second embodiment. It is noted that the same components as those in the decoding device 1 illustrated in FIG. 1 are denoted by the same reference characters, and a duplicate description of those components and their operations are omitted. The second embodiment differs from the first embodiment in adding a receiving time counter 51 to the receiving unit 10; a receiving time managing section 61, a receiving time buffer 62, a header analyzing section 63 and a sending time generator 64 to the error correcting unit 20; and a sending time managing section 71, a sending time buffer 72, a sending time counter 73 and a sending control section 74 to the sending unit 30.

The receiving time counter 51 is a timepiece for measuring time. The receiving time counter 51 outputs a receiving time of each of the media packets, which are received by the media packet receiving section 11, to the receiving time managing section 61. The receiving time counter 51 has the same time accuracy as that of the sending time counter 73 described later.

The receiving time managing section 61 manages the receiving time of each media packet. More specifically, the receiving time managing section 61 accumulates the receiving time of the media packet, which is obtained from the receiving time counter 51, in the receiving time buffer 62 for each media packet. Further, the receiving time managing section 61 outputs the receiving time of the media packet, which is obtained from the receiving time counter 51, to a sending time generating section 64a.

The restoration processing section 23 restores an RTP payload indicating a data portion of the lost media packet and a time stamp included in the RTP header. More specifically, the restoration processing section 23 obtains the media packet(s) and the FEC packet(s), which are used and/or necessary to restore the lost media packet, from the error correction buffer 25. Then, the restoration processing section 23 computes XOR of respective RTP payloads of the obtained packets, thereby restoring the RTP payload of the lost media packet. Further, the restoration processing section 23 computes XOR of respective RTP headers of the obtained packets, thereby restoring the RTP header of the lost media packet. As a result, the time stamp included in the RTP header is restored.

The restoration processing section 23 additionally accumulates the restored media packet in the position of the error correction buffer 25, which corresponds to the relevant sequence number. In addition, the restoration processing section 23 outputs information of the restored RTP header to the header analyzing section 63 in order to generate the sending time of the restored media packet. The term "time stamp" implies a value representing the timing of reproduction per media packet.

Upon receiving the RTP header of the restored media packet from the restoration processing section 23, the header analyzing section 63 extracts the time stamp and the sequence number which are included in the RTP header, and outputs them to a restored-packet sending time generating section 64b.

The sending time generator 64 includes the sending time generating section 64a and the restored-packet sending time generating section 64b.

The sending time generating section 64a generates the sending time for each of the plurality of media packets accumulated in the error correction buffer 25.

More specifically, the sending time generating section 64a obtains the number of packets to be accumulated, i.e., the number of media packets accumulated in the error correction buffer 25, from the number-of-accumulated-packets deciding section 22. In other words, the sending time generating section 64a obtains the number of to-be-accumulated packets, i.e., the number of media packets which corresponds to two of the two-dimensional matrixes and which is least necessary, when there is a loss of the media packet, to restore the lost media packet.

Further, the sending time generating section 64a generates the sending time for each of the media packets in the number of to-be-accumulated packets based on the receiving time for each of the media packets obtained from the receiving time managing section 61 and the number of to-be-accumulated packets. For example, the sending time generating section 64a calculates, as a delay time, a difference between the receiving time of one of the media packets accumulated in the error correction buffer 25, which has been first accumulated therein, and the receiving time of the media packet which has been received after (the number of to-be-accumulated packets including the relevant media packet+one packet). Further, the sending time generating section 64a adds the calculated delay time to the receiving time of each of the media packets accumulated in the error correction buffer 25, thereby generating the sending time of each media packet.

Figure 4A:
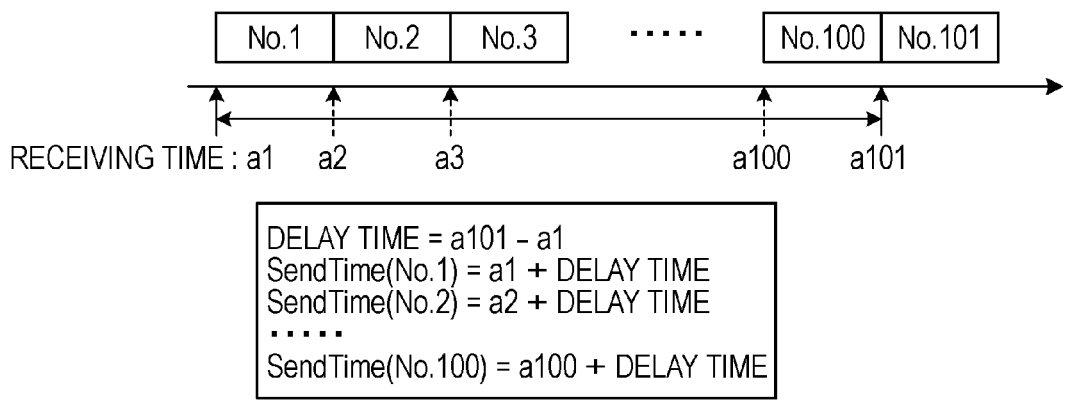
FIG. 4A illustrates a manner of calculating a sending time in the case of PRO-MPEG using a (10×5) matrix.

How the sending time generating section 64a calculates the sending time for each of the media packets in the number of to-be-accumulated packets is described below, by way of example, with reference to FIG. 4A. FIG. 4A illustrates a manner of calculating a sending time in the case of PRO-MPEG using a (10×5) matrix. As illustrated in FIG. 4A, because of PRO-MPEG using a two-dimensional matrix of 5 rows and 10 columns, the number of to-be-accumulated packets is equal to the number of media packets which are arranged in two of the two-dimensional matrixes, i.e., 10×5×

2. Hence, 100 media packets are arranged in the order of No. 1, No. 2, . . . , and No. 100 at which the media packets have been received. The receiving times of the media packets are assumed to be a1, a2, . . . , a100, respectively, in the order at which they have been received.

At the time when the media packet No. 101, which is arranged in a succeeding (e.g., third) two-dimensional matrix, is received, the media packets from No. 1 to No. 100 already accumulated in the error correction buffer 25 are all in a sendable state. For example, the media packets from No. 1 to No. 100 in ready to be sent to the sending unit 30.

Accordingly, the sending time generating section 64a calculates, as a delay time, a difference between the receiving time a100 of the media packet No. 101 and the receiving time a1 of the media packet No. 1. Further, the sending time generating section 64a sets a time, which is obtained by adding the delay time to the receiving time of each media packet, as the sending time of each media packet. Thus, the sending time generating section 64a can successively output the media packets, which are accumulated in the error correction buffer 25, to the sending unit 30, thereby reducing the likelihood of and/or avoiding the occurrence of a burst.

Returning to FIG. 3, the sending time generating section 64a outputs the generated sending time for each of the media packets in the number of to-be-accumulated packets and the corresponding sequence number as a pair to the sending time managing section 71.

The restored-packet sending time generating section 64b generates a sending time of the restored media packet.

More specifically, the restored-packet sending time generating section 64b obtains the time stamp and the sequence number of the restored media packet from the header analyzing section 63. Then, the restored-packet sending time generating section 64b generates the sending time of the restored media packet. The sending time of the restored media packet may be based on not only the obtained time stamp of the restored media packet, but also the sending time and the time stamp of the media packet having the sequence number immediately before the obtained sequence number of the restored media packet.

For example, the restored-packet sending time generating section 64b obtains, from the sending time generating section 64a, the sending time of the media packet having the sequence number immediately before the sequence number of the restored media packet. Also, the restored-packet sending time generating section 64b obtains, from the error correction buffer 25, the media packet having the sequence number immediately before the sequence number of the restored media packet, and then extracts the time stamp from the RTP header of the obtained media packet. Further, the restored-packet sending time generating section 64b generates the sending time of the restored media packet by calculating a difference between the respective time stamps of the just-preceding media packet and the restored media packet, and by adding the calculated difference to the sending time of the just-preceding media packet.

Figure 4B:
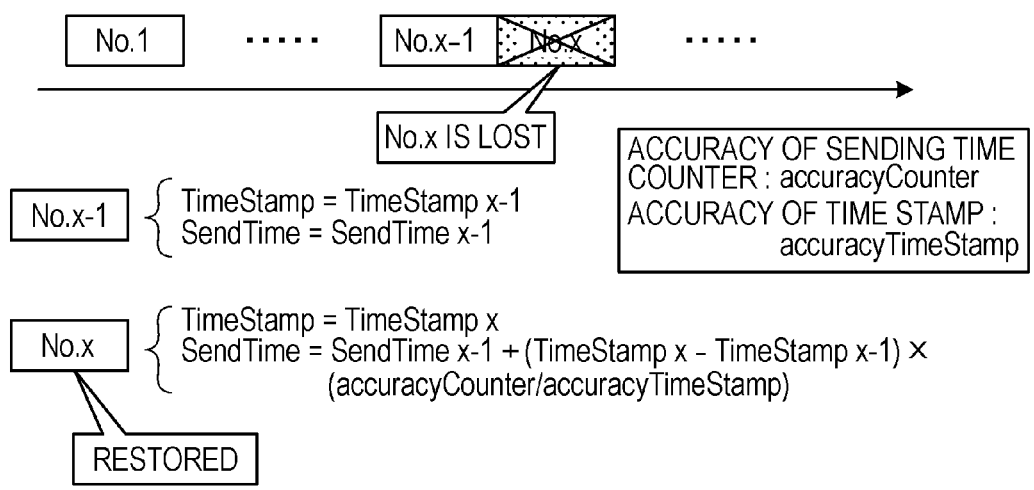
FIG. 4B illustrates a manner of calculating a sending time for a restored packet in the case of PRO-MPEG using a (10×5) matrix.

How the restored-packet sending time generating section 64b calculates the sending time of the restored media packet is be described below, by way of example, with reference to FIG. 4B. FIG. 4B illustrates a manner of calculating the sending time of the restored media packet in the case of PRO-MPEG using a (10×5) matrix. As illustrated in FIG. 4B, when a lost media packet No. x (x=1 to 100) is restored, the sending time of the restored media packet No. x is generated by using a media packet No. x−1 just preceding the media packet No. x.

For example, the sending time (SendTime) of the restored media packet No. x is generated as follows. Assumed that "TimeStamp x" represents the time stamp of the restored media packet No. x, and that "SendTime x−1" and "TimeStamp x−1" respectively represent the sending time and the time stamp of the media packet No. x−1 just preceding the restored media packet No. x. Further, "accuracyCounter" represents the accuracy of the sending time counter, and "accuracyTimeStamp" represents the accuracy of the time stamp.

$$\text{SendTime} = \text{SendTime}\,x{-}1 + (\text{TimeStamp}\,x - \text{TimeStamp}\,x{-}1) \times (\text{accuracyCounter}/\text{accuracyTimeStamp})$$

Stated another way, the restored-packet sending time generating section 64b calculates the difference in the time stamp between the restored media packet No. x and the just-preceding media packet No. x−1, and then adjusts the calculated difference in the time stamp in conformity with the accuracy of the sending time counter. Further, the restored-packet sending time generating section 64b adds the adjusted difference in the time stamp to the sending time of the just-preceding media packet No. x−1, thereby calculating the sending time of the restored media packet No. x.

Returning to FIG. 3, the restored-packet sending time generating section 64b outputs the generated sending time of the restored media packet and the corresponding sequence number as a pair to the sending time managing section 71.

While in the above description the restored-packet sending time generating section 64b employs the media packet having the sequence number immediately before the sequence number of the lost media packet to generate the sending time of the lost media packet, the manner of generating the sending time of the lost media packet is not limited to such a manner. As an alternative, the media packet having the sequence number immediately after the sequence number of the lost media packet may also be employed, for example.

The sending time managing section 71 accumulates, in the sending time buffer 72, the sending time and the sequence number, both of which are output from the sending time generating section 64a, for each of the media packets in the number of to-be-accumulated packets. For example, the sending time generating section 64a outputs the sending time and the sequence number for media packets that are not restored (e.g., not lost). Also, the sending time managing section 71 accumulates, in the sending time buffer 72, the sending time and the sequence number of the restored media packet, both of which are output from the restored-packet sending time generating section 64b. Further, the sending time managing section 71 successively obtains the sending times and the sequence numbers of the media packets accumulated in the sending time buffer 72 according to the order of the sequence number, and then outputs the sending times and the sequence numbers to the sending control section 74.

The sending time counter 73 is a timepiece for measuring time.

The sending control section 74 monitors the sending time of the media packet, which corresponds to the sequence number output from the sending time managing section 71, by using the sending time counter 73. The sending control section 74 executes control such that the relevant media packet is output at the relevant sending time. More specifically, upon obtaining the sending time and the sequence number of the media packet which corresponds to the sequence number output from the sending time managing section 71, the sending control section 74 requests the buffer managing section 24 to output the media packet having the relevant sequence number when the relevant sending time reaches the time obtained from the sending time counter 73 (i.e., when a value representing the relevant sending time becomes equal to or smaller than a value of the sending time counter 73).

Upon receiving the request to output the media packet having the sequence number designated by the sending control section 74, the buffer managing section 24 obtains the media packet having the designated sequence number from the error correction buffer 25, and then outputs the obtained media packet to the RTP buffer 31.

The method of a sending time generation process in the decoding device 1 according to the second embodiment is described below with reference to FIG. 5. FIG. 5 is a flowchart illustrating the method of the sending time generation process in the decoding device 1 according to the second embodiment. It is here assumed that the number of to-be-accumulated packets decided by the number-of-accumulated-packets deciding section 22 is output to the sending time generating section 64a.

First, when the media packet receiving section 11 receives the media packet output from the encoding device 2, the receiving time counter 51 outputs the receiving time of the relevant media packet to the receiving time managing section 61. Then, the receiving time managing section 61 accumulates the receiving time of the relevant media packet in the receiving time buffer 62 (S21).

Upon obtaining the number of to-be-accumulated packets from the number-of-accumulated-packets deciding section 22, the sending time generating section 64a calculates a delay time to calculate the sending time of each of the media packets in the obtained number of to-be-accumulated packets (S22). For example, the sending time generating section 64a obtains, from the receiving time managing section 61, the receiving time of one of the media packets accumulated in the error correction buffer 25, which has been first accumulated therein, and the receiving time of the media packet which has been received after (the number of to-be-accumulated packets including the relevant media packet+one packet). Further, the sending time generating section 64a calculates, as the delay time, a difference between those receiving times.

Upon obtaining the receiving time of each of the media packets, which are accumulated in the error correction buffer 25, in the number of to-be-accumulated packets from the receiving time managing section 61, the sending time generating section 64a calculates the sending time of each media packet by using the calculated delay time (S23), and then outputs the calculated sending time to the sending time managing section 71. More specifically, the sending time generating section 64a calculates the sending time of each media packet by adding the calculated delay time to the receiving time of each media packet.

When the lost media packet is restored, the header analyzing section 63 extracts the time stamp included in the RTP header of the restored media packet (S24), and then outputs the extracted time stamp to the restored-packet sending time generating section 64b.

Upon receiving the time stamp of the restored media packet, the restored-packet sending time generating section 64b calculates the sending time of the restored media packet (S25), and then outputs the calculated sending time to the sending time managing section 71. More specifically, the restored-packet sending time generating section 64b calculates a difference between the time stamp of the restored media packet and the time stamp of the media packet having the sequence number immediately before the sequence number of the restored media packet. Further, the restored-packet sending time generating section 64b adds the calculated difference to the sending time of the just-preceding media packet, thereby calculating the sending time of the restored media packet.

While in the above description the restored-packet sending time generating section 64b employs the media packet having the sequence number immediately before the sequence number of the restored media packet to calculate the sending time of the restored media packet, it may employ, instead, the media packet having the sequence number immediately after the sequence number of the restored media packet.

When the sending control section 74 successively obtains the sending times of the media packets from the sending time managing section 71 in the order of the sequence numbers of the media packets, the sending control section 74 monitors the sending time by using the sending time counter 73 and determines whether the obtained sending time reaches the time obtained from the sending time counter 73 (i.e., whether a value representing the obtained sending time becomes equal to or smaller than a value of the sending time counter 73) (S26).

If it is determined that the relevant sending time does not reach the time obtained from the sending time counter 73 (No in S26), the sending control section 74 continuously monitors the sending time by using the sending time counter 73.

On the other hand, if it is determined that the relevant sending time reaches the time obtained from the sending time counter 73 (Yes in S26), the sending control section 74 requests the buffer managing section 24 to output the media packet while designating the sequence number (S27).

Upon receiving the request to output the media packet having the designated sequence number, the buffer managing section 24 obtains the designated media packet from the error correction buffer 25 and outputs the obtained media packet to the RTP buffer 31 (S28).

Subsequently, the sending time managing section 71 determines whether the sending times accumulated in the sending time buffer 72 have been all processed (S29).

If it is determined that the sending times are not yet all processed (No in S29), the sending time managing section 71 causes the method to return to S26 to process the next sending time.

On the other hand, if it is determined that the sending times have been all processed (Yes in S29), the sending time managing section 71 causes the method to end.

According to the second embodiment, as described above, the decoding device 1 receives a plurality of media packets arranged in rows and columns, and also receives a plurality of FEC packets. The plurality of FEC packets are produced one per row and per column of the plurality media packets. Further, each of the plurality of FEC packets includes the matrix configuration information regarding the plurality of media packets. Further, the decoding device 1 decides the number of packets to be accumulated, which is least necessary to restore the lost media packet, based on the extracted matrix configuration information regarding the plural media packets, the matrix configuration information being included in the received FEC packet. Still further, the decoding device 1 accumulates the media packets received in the decided number of packets to be accumulated and the FEC packets received at the same timings as predetermined ones of those media packets. When a loss of any of the received media packets is detected, the decoding device 1 restores the media packet, for which the loss has been detected. The media packet is restored by using the accumulated media packet(s) and FEC packet(s). In addition, the decoding device 1 generates the sending time for each of the plurality of accumulated media packets based on the receiving time of the received media packet and the decided number of packets to be accumulated.

With the above-described features, since the decoding device 1 can start the process of restoring the lost media packet immediately after accumulating the media packets in the least necessary number of to-be-accumulated packets to restore the lost media packet, a delay time caused by accumulating the media packets can be shortened and a delay time taken until shifting to the process in the subsequent decoding processing unit 40 can also be shortened. As a result, particularly, when a data stream is at a low bit rate, the decoding device 1 can shorten the delay time and hence can reduce a load imposed on the subsequent decoding processing unit 40.

Further, since the decoding device 1 generates the sending time of each of plural media packets accumulated in the number of to-be-accumulated packets and successively sends the media packets in the number of to-be-accumulated packets to the decoding processing unit 40, it is possible to eliminate the occurrence of a burst that the plural media packets are sent to the decoding processing unit 40 at a time. As a result, the decoding device 1 can greatly reduce a load imposed on the subsequent decoding processing unit 40.

In the above-described second embodiment, the decoding device 1 accumulates a plurality of media packets in the least necessary number of to-be-accumulated packets to restore the lost media packet, and generates the sending time of each of the accumulated media packets including the media packet restored from the lost state, followed by successively sending the media packets to the decoding processing unit 40. However, the invention is not limited to the second embodiment, and it may be designed such that the decoding device 1 accumulates a plurality of media packets in the least necessary number of to-be-accumulated packets to restore the lost media packet, and further generates a sending time of each of the accumulated media packets including the restored media packet when there occurs a delay on the network 3.

The following description is therefore made for the case, as a third embodiment, where the decoding device 1 accumulates a plurality of media packets in the least necessary number of to-be-accumulated packets to restore the lost media packet, and further generates the sending time of each of the accumulated media packets including the restored media packet when there occurs a delay on the network 3, thereby eliminating a burst that many media packets are sent to the decoding processing unit 40 at a time.

Figure 6:
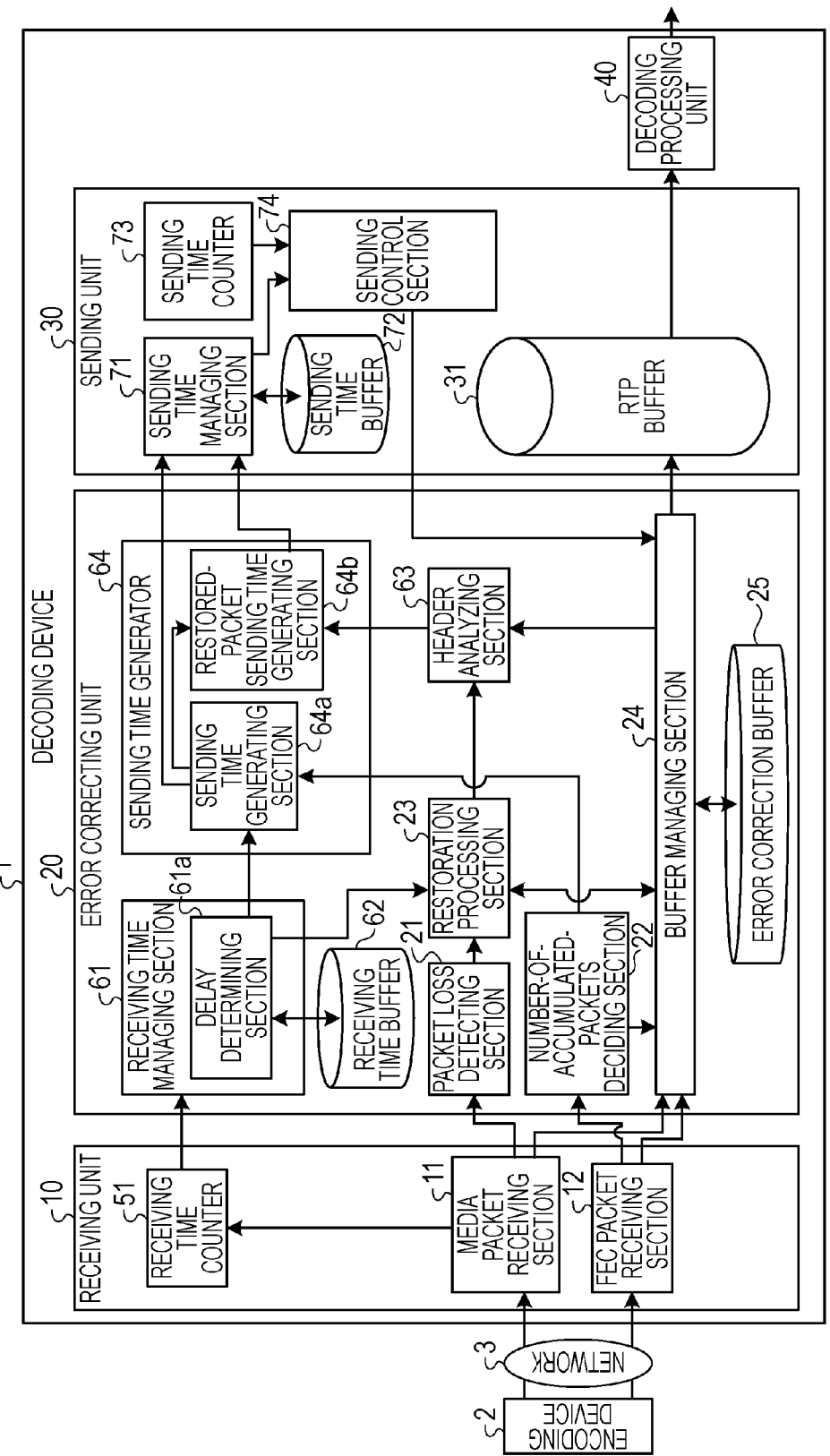
FIG. 6 is a functional block diagram illustrating the configuration of a decoding device according to a third embodiment.

First, the configuration of a decoding device 1 according to the third embodiment is described with reference to FIG. 6. FIG. 6 is a functional block diagram illustrating the configuration of the decoding device 1 according to the third embodiment. It is noted that the same components as those in the decoding device 1 illustrated in FIG. 3 are denoted by the same reference characters and a duplicate description of those components and their operations are omitted. The third embodiment differs from the second embodiment in adding a delay determining section 61a to the error correcting unit 20.

The delay determining section 61a checks the interval at which the media packets are received, and determines per media packet whether the media packet has been received with a delay for some reason on the network 3, for example. More specifically, upon obtaining the receiving time of the media packet, which is output from the receiving time counter 51, from the receiving time managing section 61, the delay determining section 61a determines, based on the obtained receiving time of the relevant media packet and the receiving time of the media packet which was received immediately before the relevant media packet, whether a time duration of a specified value has elapsed. The specified value may be a predetermined value is set in advance depending on the communication rate.

If it is determined that the media packet has been received with the delay, the delay determining section 61a judges that data in the relevant media packet lacks reliability, and then requests the restoration processing section 23 to restore the relevant media packet. On the other hand, if it is determined that the media packet has been received with no delay, the delay determining section 61a outputs the receiving time of the relevant media packet, which has been obtained from the receiving time counter 51, to the sending time generating section 64a.

The restoration processing section 23 restores the RTP payload representing a data portion of the delayed media packet, and the time stamp included in the RTP header. A restoration method is similar to that in the case of restoring the lost media packet, and hence a detailed description thereof is omitted. Further, the restoration processing section 23 outputs information of the restored RTP header to the header analyzing section 63 in order to generate the sending time of the restored media packet.

Figure 7:
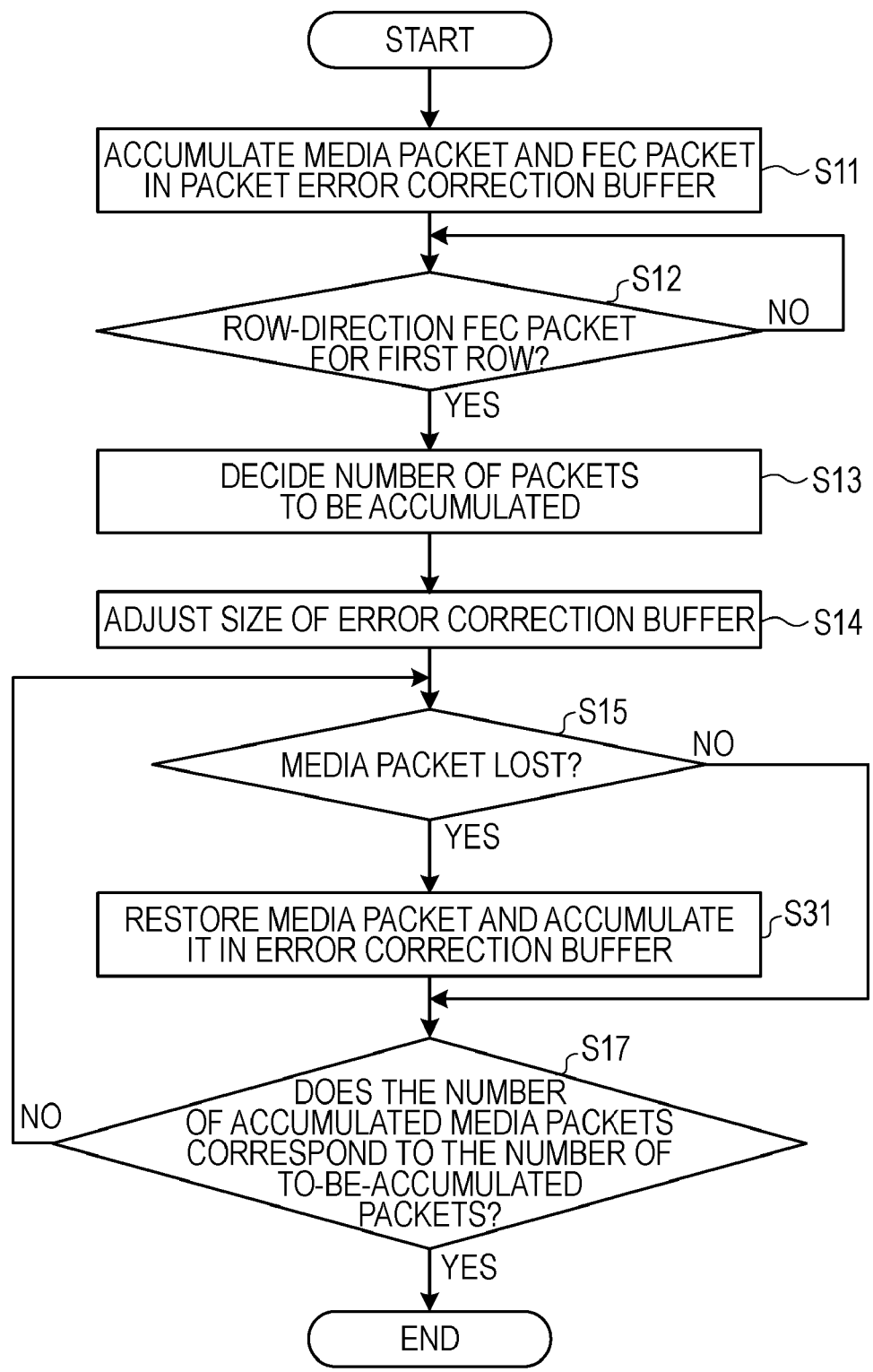
FIG. 7 is a flowchart illustrating an error correction method in the decoding device according to the third embodiment.

The method of an error correction process in the decoding device 1 according to the third embodiment is described below with reference to FIG. 7. FIG. 7 is a flowchart illustrating the method of the error correction process in the decoding device 1 according to the third embodiment. It is noted that the processes or operations of the method in FIG. 7 that are the same as those (in FIG. 2) of the error correction method of the decoding device 1 according to the first embodiment are denoted by the same reference characters and a detailed description thereof is omitted.

First, upon receiving the media packet output from the encoding device 2, the media packet receiving section 11 accumulates the received media packet in the error correction buffer 25 (S11), and outputs the received media packet to the packet loss detecting section 21. Also, the FEC packet receiving section 12 accumulates the FEC packet, which is output from the encoding device 2, in the error correction buffer 25 (S11).

Further, the FEC packet receiving section 12 determines whether the received FEC packet is the row-direction FEC packet for the first row among the FEC packets produced to recover the loss of any of the media packets arranged in the two-dimensional matrix (S12).

If it is determined that the received FEC packet is the row-direction FEC packet for the first row (Yes in S12), the number-of-accumulated-packets deciding section 22 extracts the matrix configuration information regarding the two-dimensional matrix from a TCP header of the FEC packet and decides the number of packets to be accumulated, which is least necessary to restore the lost media packet, based on the extracted matrix configuration information (S13).

Then, the buffer managing section 24 adjusts the error correction buffer 25 based on the number of to-be-accumulated packets, which has been decided by the number-of-accumulated-packets deciding section 22, as an effective size of the error correction buffer 25 (S14).

The packet loss detecting section 21 monitors the sequence number included in the RTP header of the obtained media packet which is output from the media packet receiving section 11 (S15). If a media packet is lost (Yes in S15), the packet loss detecting section 21 requests the restoration processing section 23 to restore the lost media packet.

Upon receiving the request to restore the lost media packet from the packet loss detecting section 21, the restoration processing section 23 restores the lost media packet by using the FEC packet(s) and the media packet(s) accumulated in the error correction buffer 25, and then accumulates the restored media packet in the error correction buffer 25 (S31).

Further, upon receiving the request to restore the delayed media packet from the delay determining section 61a, the restoration processing section 23 restores the delayed media packet by using the FEC packet(s) and the media packet(s) accumulated in the error correction buffer 25, and then accumulates the restored media packet in the error correction buffer 25 (S31).

Thereafter, the buffer managing section 24 determines whether the number of media packets accumulated in the error correction buffer 25 correspond to the number of to-be-accumulated packets (S17).

If it is determined that the number of media packets accumulated in the error correction buffer 25 does not correspond to the number of to-be-accumulated packets (No in S17), the buffer managing section 24 causes the method to return to S15 to restore the lost media packet or the delayed media packet, for example.

If it is determined that the number of media packets included in the error correction buffer 25 corresponds to the number of to-be-accumulated packets (Yes in S17), the buffer managing section 24 causes the error correction method to end.

Figure 8:
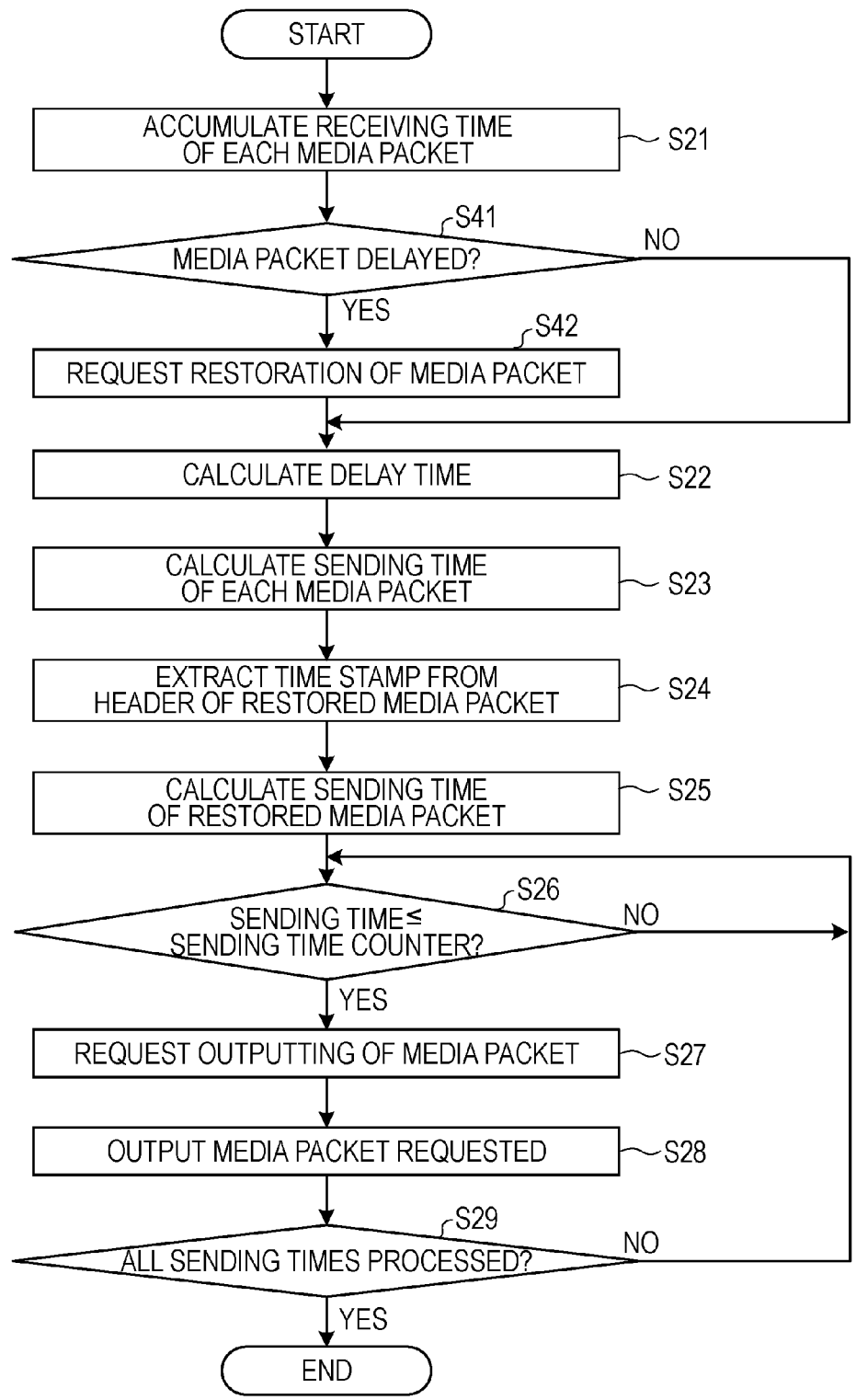
FIG. 8 is a flowchart illustrating a sending time generation method in the decoding device according to the third embodiment.
Figure 9:
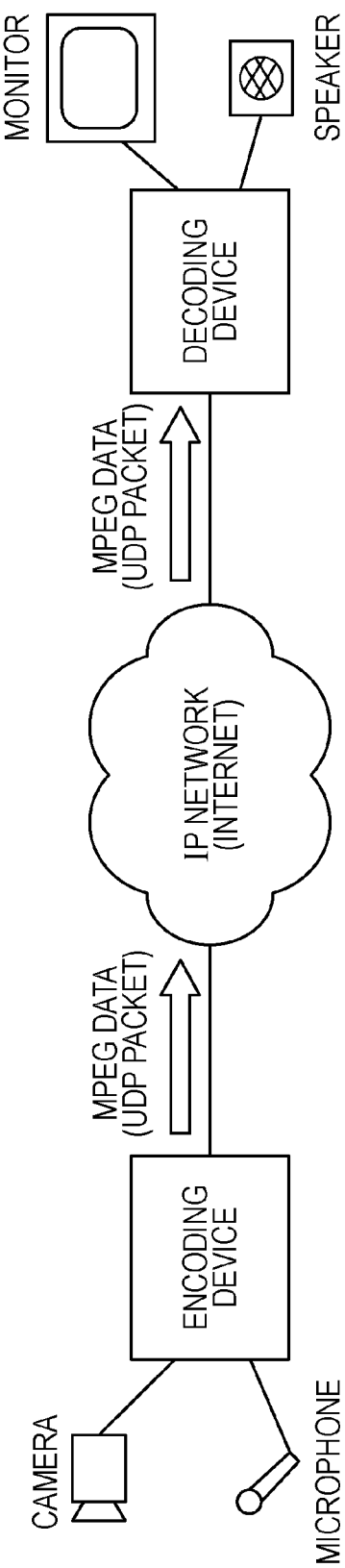
FIG. 9 illustrates a known image and voice delivery system.
Figure 10:
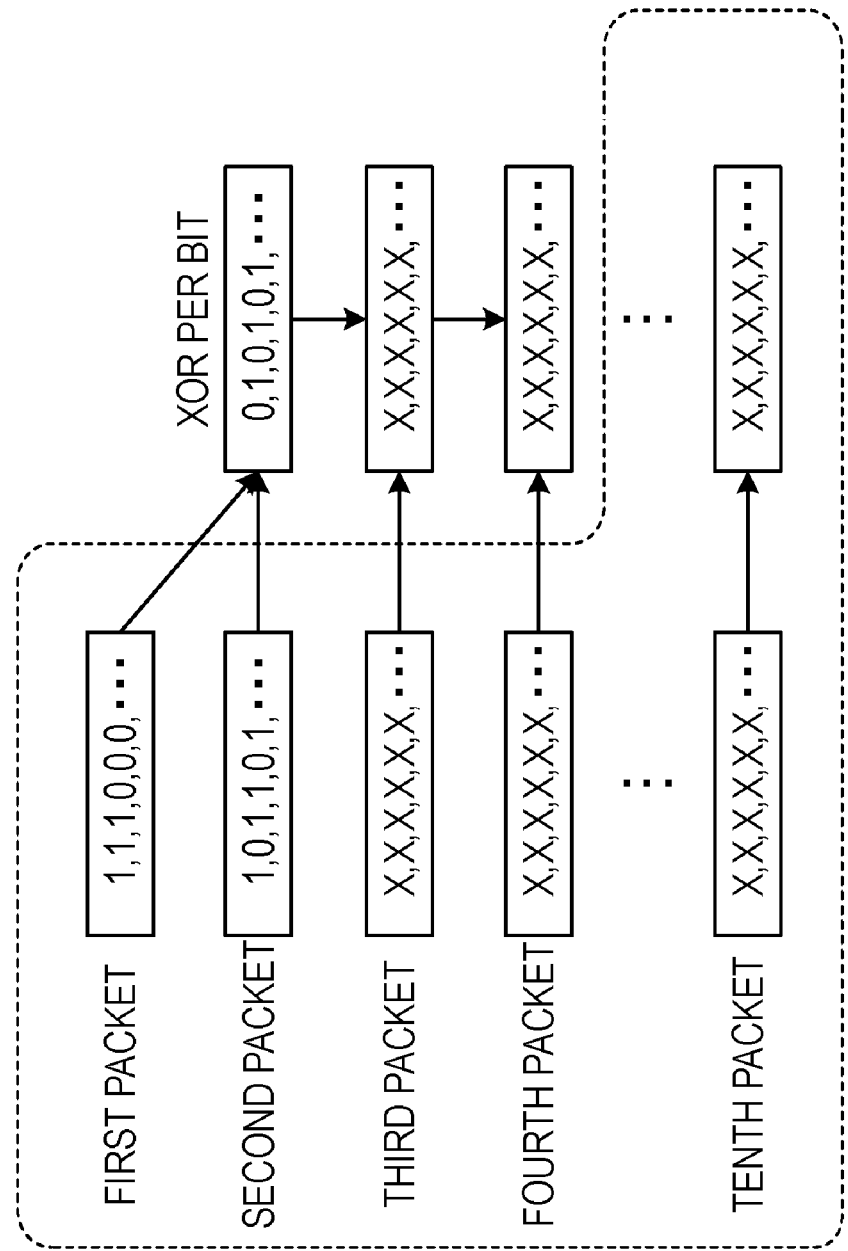
FIG. 10 illustrates one example of a manner of producing an FEC packet.
Figure 11:
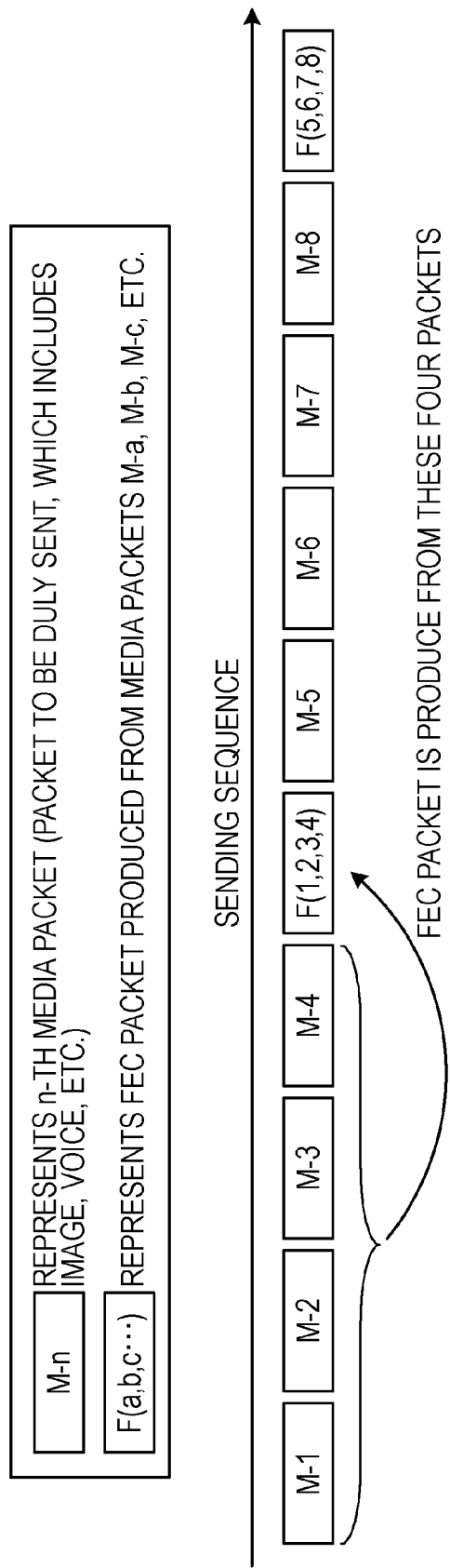
FIG. 11 illustrates a manner of inserting the FEC packet.
Figure 12:
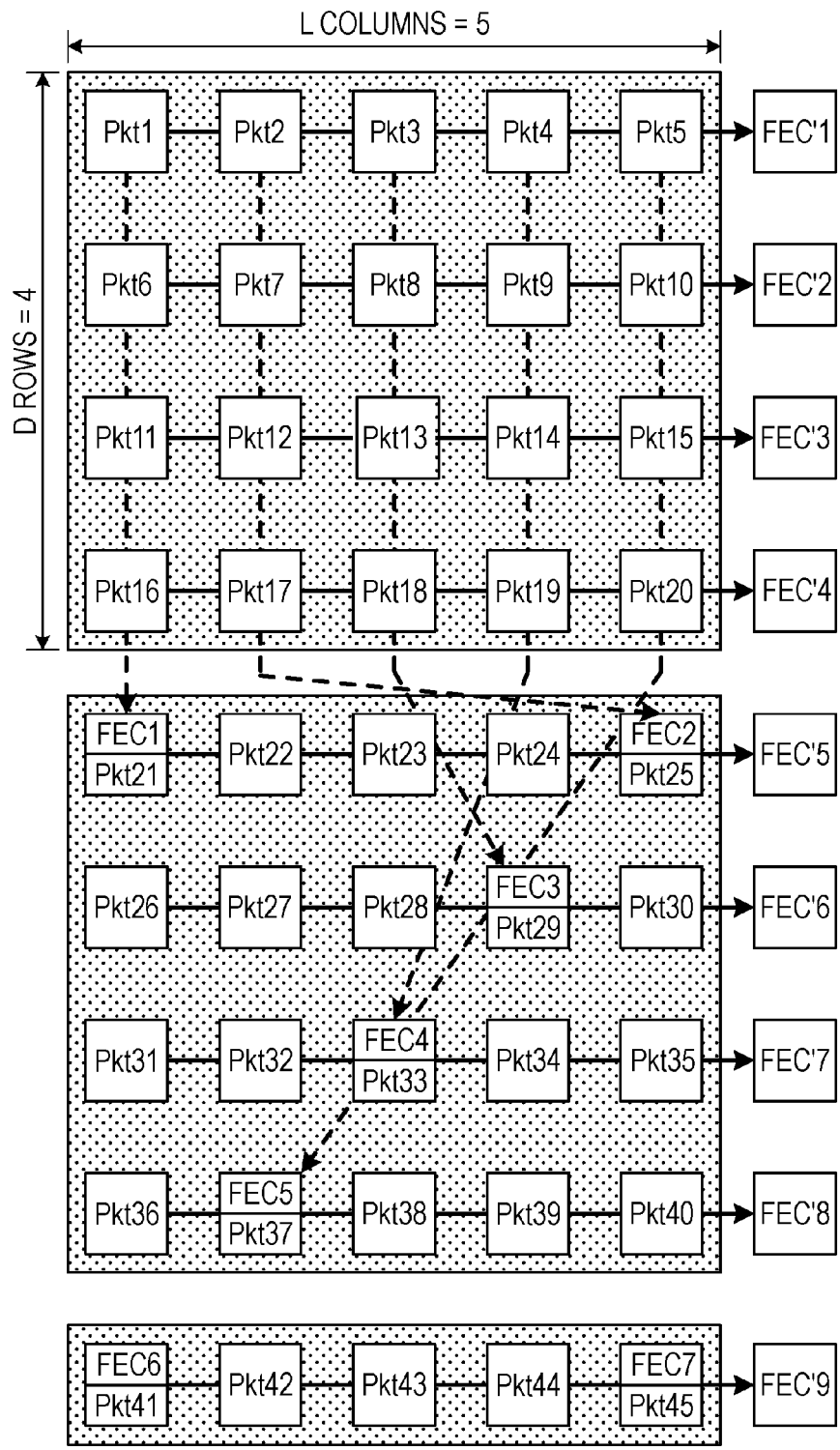
FIG. 12 illustrates a manner of inserting FEC packets based on the PRO-MPEG method.
Figure 13:
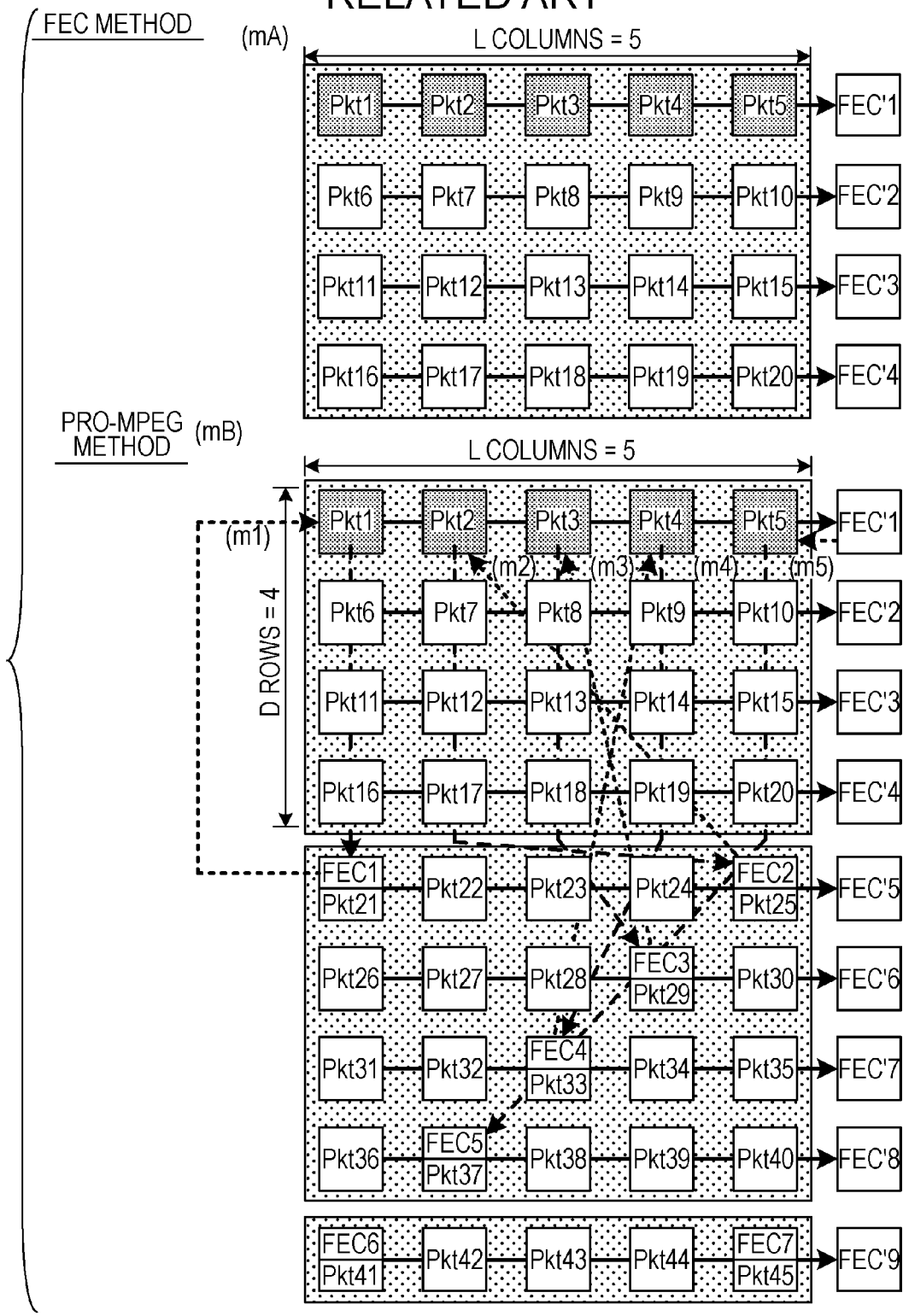
FIG. 13 illustrates the feature of FEC using the PRO-MPEG method.

The processes and/or operations of a sending time generation method in the decoding device 1 according to the third embodiment will be described below with reference to FIG. 8. FIG. 8 is a flowchart illustrating the processes and/or operations of the sending time generation method in the decoding device 1 according to the third embodiment. It is assumed in the following example, that the number of to-be-accumulated packets decided by the number-of-accumulated-packets deciding section 22 is output to the sending time generating section 64a. The processes and/or operations of the method in FIG. 8 that are the same as those (in FIG. 5) of the sending time generation method in the decoding device 1 according to the second embodiment are denoted by the same reference characters and a detailed description thereof is omitted.

First, when the media packet receiving section 11 receives the media packet output from the encoding device 2, the receiving time counter 51 outputs the receiving time of the relevant media packet to the receiving time managing section 61. Then, the receiving time managing section 61 accumulates the receiving time of the relevant media packet in the receiving time buffer 62 (S21).

Upon obtaining the receiving time of the media packet from the receiving time managing section 61, the delay determining section 61a determines whether the relevant media packet is delayed (S41). More specifically, the delay determining section 61a determines, based on the obtained receiving time of the relevant media packet and the receiving time of the media packet which was received immediately before the relevant media packet, whether a time duration of a specified value has elapsed.

If it is determined that the media packet is delayed (Yes in S41), the delay determining section 61a judges that data in the relevant media packet lacks reliability, and then requests the restoration processing section 23 to restore the relevant media packet (S42). On the other hand, if it is determined that the media packet is not delayed (No in S41), the delay determining section 61a shifts to S22.

Upon obtaining the number of to-be-accumulated packets from the number-of-accumulated-packets deciding section 22, the sending time generating section 64a calculates a delay time to calculate the sending time of each of the media packets in the obtained number of to-be-accumulated packets (S22).

Upon obtaining the receiving time of each of the media packets, which are accumulated in the error correction buffer 25, in the number of to-be-accumulated packets from the receiving time managing section 61, the sending time generating section 64a calculates the sending time of each media packet by using the calculated delay time (S23), and then outputs the calculated sending time to the sending time managing section 71.

When the lost media packet is restored, the header analyzing section 63 extracts the time stamp included in the RTP header of the restored media packet (S24), and then outputs the extracted time stamp to the restored-packet sending time generating section 64b.

Upon receiving the time stamp of the restored media packet, the restored-packet sending time generating section 64b calculates the sending time of the restored media packet (S25), and then outputs the calculated sending time to the sending time managing section 71. More specifically, the restored-packet sending time generating section 64b calculates a difference between the time stamp of the restored media packet and the time stamp of the media packet having the sequence number immediately before the sequence number of the restored media packet. Further, the restored-packet sending time generating section 64b adds the calculated difference to the sending time of the just-preceding media packet, thereby calculating the sending time of the restored media packet.

As a result, the restored-packet sending time generating section 64b can correct the delay time of the delayed media packet and can shorten a delay in sending the delayed media packet to the decoding processing unit 40.

Upon obtaining the sending times of the media packets from the sending time managing section 71 in the order of the sequence numbers of the media packets, the sending control section 74 monitors the sending time by using the sending time counter 73 and determines whether the obtained sending time reaches the time obtained from the sending time counter 73 (i.e., whether a value representing the obtained sending time becomes equal to or smaller than a value of the sending time counter 73) (S26).

If it is determined that the relevant sending time does not reach the time obtained from the sending time counter 73 (No in S26), the sending control section 74 continuously monitors the sending time by using the sending time counter 73.

On the other hand, if it is determined that the relevant sending time reaches the time obtained from the sending time counter 73 (Yes in S26), the sending control section 74 requests the buffer managing section 24 to output the media packet while designating the sequence number (S27).

Upon receiving the request to output the media packet having the designated sequence number, the buffer managing section 24 obtains the designated media packet from the error correction buffer 25 and outputs it to the RTP buffer 31 (S28).

Then, the sending time managing section 71 determines whether the sending times accumulated in the sending time buffer 72 have been all processed (S29).

If it is determined that the sending times are not yet all processed (No in S29), the sending time managing section 71 causes the method to return to S26 to process the next sending time.

On the other hand, if it is determined that the sending times have been all processed (Yes in S29), the sending time managing section 71 causes the sending time generation method to end.

According to the third embodiment, as described above, the decoding device 1 receives a plurality of media packets arranged in plural rows and plural columns, and also receives a plurality of FEC packets which are produced one per row and per column of the plural media packets and each of which includes the matrix configuration information regarding the plural media packets. Further, the decoding device 1 decides the number of packets to be accumulated, which is least necessary to restore the lost media packet, based on the extracted matrix configuration information regarding the plural media packets, the matrix configuration information being included in the received FEC packet. Still further, the decoding device 1 accumulates the media packets received in the decided number of packets to be accumulated and the FEC packets received at the same timings as predetermined ones of those media packets. In addition, the decoding device 1 determines whether the receiving time of the received media packet elapses by a predetermined time or longer from the receiving time of the media packet received immediately before the relevant media packet. If it is determined that the receiving time of the received media packet elapses by the predetermined time or longer, the received media packet is restored and the sending time of each of the plural accumulated media packets, including the restored media packet, is generated.

With the above-described features, since the decoding device 1 can start the process of restoring the delayed media packet immediately after accumulating the media packets in the least necessary number of to-be-accumulated packets to restore the delayed media packet even when a delay occurs on the network 3, for example, a delay time caused by accumulating the media packets can be shortened and a delay time taken until shifting to the process in the subsequent decoding processing unit 40 can also be shortened. As a result, particularly, when a data stream is at a low bit rate, the decoding device 1 can shorten the delay time and hence can reduce a load imposed on the subsequent decoding processing unit 40.

Further, since the decoding device 1 generates the sending time of each of plural media packets, including the restored media packet, accumulated in the number of to-be-accumulated packets and successively sends the media packets in the number of to-be-accumulated packets to the decoding processing unit 40, it is possible to reduce and/or eliminate the occurrence of a burst that the plural media packets are sent to the decoding processing unit 40 at a time. As a result, the decoding device 1 can greatly reduce a load imposed on the subsequent decoding processing unit 40.

The embodiments have been described above in connection with the case where the receiving unit 10, the error correcting unit 20, and the sending unit 30 are arranged inside the decoding device 1. However, the invention is not limited to such an arrangement. As an alternative, the receiving unit 10, the error correcting unit 20, and the sending unit 30 may be arranged outside the decoding device 1. In such a case, an error correcting device is made up of the receiving unit 10, the error correcting unit 20, and the sending unit 30, and it is connected to the decoding device 1.

While the embodiments of the invention have been described above, it is needless to say that the scope of the technical concept of the invention is in no way restricted by the above-described embodiments and the invention can be implemented in other various embodiments without departing from the technical scope of the invention defined in the claims.

Also, the components of the decoding device 1 are illustrated to represent the decoding device 1 in a functional and conceptual way, and the decoding device 1 is not always required to be physically constituted as per illustrated in the figures. As a matter of course, practically available embodiments of the decoding device 1 are not limited to the illustrated ones.

The processing functions executed in the decoding device 1 may be realized, in its entirety or its optional part, with a CPU (Central Processing Unit) (or a microcomputer such as an MPU (Micro Processing Unit) or an MCU (Micro Controller Unit) and a program analyzed and executed by the CPU (or the microcomputer such as the MPU or the MCU. As an alternative, those processing functions may also be realized with hardware using wired logics.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the invention(s) has(have) been described in detail, it should be understood that the various changes, substitutions, and alterations could be made hereto without departing from the spirit and scope of the invention.

What is claimed is:

1. A decoding device comprising:
   a first receiving section to receive a plurality of data packets arranged in rows and columns;
   a second receiving section to receive a plurality of error correction packets, the plurality of error correction packets includes an error correction packet for each row and for each column, each of the plurality of error correction packets includes matrix configuration information regarding the plurality of data packets;
   a deciding section to decide, based on the matrix configuration information, a number of packets to be accumulated to restore a lost data packet;
   an accumulating section to accumulate the data packets received by the first receiving section in the number of packets to be accumulated; and
   a restoring section to, when a loss of any of the data packets received by the first receiving section is detected, restore the lost data packet by using at least one of the data packets and at least one of the error correction packets, which have been accumulated by the accumulating section.

2. The decoding device according to claim 1, wherein the number of packets to be accumulated is a least necessary number of packets to be accumulated to restore the lost data packet.

3. The decoding device according to claim 1, wherein at least a portion of the error correction packets and the data packets are received at a same time.

4. The decoding device according to claim 1, wherein the deciding section decides, as the number of packets to be accumulated, a value obtained from multiplying 2 and the number of data packets, the number of data packets being calculated by multiplying the number of rows by the number of columns, the number of rows and the number of columns being indicated by the matrix configuration information regarding the plural data packets.

5. The decoding device according to claim 1, further comprising:
   a sending time generating section to generate sending times of the plurality of data packets, which have been accumulated by the accumulating section, the sending times being based on a receiving time for each of the plurality of data packets and the number of packets to be accumulated.

6. The decoding device according to claim 5, wherein the sending time generating section generates the sending time of each data packet by
calculating, as a delay time, a difference between the receiving time of a first data packet among the data packets accumulated by the accumulating section, and the receiving time of a second data packet, the second data packet being a data packet received immediately after the data packets in the number of to-be-accumulated packets have been received, and
adding the calculated delay time to the receiving time of each data packet.

7. The decoding device according to claim 5, wherein the sending time generating section includes a restored-packet sending time generating section to generate a sending time of a restored data packet, the sending time of the restored data packet being based on the sending time of a data packet immediately before or after the restored data packet, the data packet immediately before or after the restored data packet being identified based on sampling numbers of the restored data packet and the data packet immediately before or after the restored data packet.

8. The decoding device according to claim 5, further comprising:
a sending section to send each of the data packets, which have been accumulated by the accumulating section, to a decoder based on the sending times generated by the sending time generating section.

9. The decoding device according to claim 1, further comprising:
a determining section to determine whether a data packet of the plurality of data packets is delayed based on receiving time of a the data packet and a receiving time of a data packet received immediately before the data packet,
wherein, when the determining section determines that a time duration between the receiving time of the data packet and the receiving time of the data packet received immediately before the data packet is longer that a specified time duration, the data packet is determined delayed, and
the restoring section restores the data packet by using at least one of the data packets and at least one of the error correction packets, which have been accumulated by the accumulating section.

10. A decoding method comprising:
receiving a plurality of data packets arranged in rows and columns;
receiving a plurality of error correction packets, the plurality of error correction packets includes an error correction packet for each row and each column, each of the plurality of error correction packets includes matrix configuration information regarding the plurality of data packets;
deciding, based on the matrix configuration information, a number of packets to be accumulated to restore a lost data packet;
accumulating the received data packets in the number of packets to be accumulated; and
restoring, when a loss of any of the received data packets is detected, the lost data packet by using at least one of the data packets and at least one of the error correction packets, which have been accumulated in the accumulating.

11. The decoding method according to claim 10, wherein the number of packets to be accumulated is a least necessary number of packets to be accumulated to restore the lost data packet.

12. The decoding method according to claim 10, wherein at least a portion of the error correction packets and the data packets are received at a same time.

13. A media data delivery system comprising an encoding device for encoding media data including image data and/or voice data, and a decoding device connected to the encoding device via a network and decoding the media data, the decoding device comprising:
a first receiving section to receive, from the encoding device, a plurality of data packets arranged in rows and columns;
a second receiving section to receive, from the encoding device, a plurality of error correction packets, the plurality of error correction packets includes an error correction packet for each row and for each column, each of the plurality of error correction packets includes matrix configuration information regarding the plurality of data packets;
a deciding section to decide, based on the matrix configuration information, a number of packets to be accumulated to restore a lost data packet;
an accumulating section to accumulate the data packets received by the first receiving section in the number of packets to be accumulated; and
a restoring section to, when a loss of any of the data packets received by the first receiving section is detected, restore the lost data packet by using at least one of the data packets and at least one of the error correction packets, which have been accumulated by the accumulating section.

14. The system according to claim 13, wherein the number of packets to be accumulated is a least necessary number of packets to be accumulated to restore the lost data packet.

15. The system according to claim 13, wherein at least a portion of the error correction packets and the data packets are received at a same time.

* * * * *